US008164085B2

(12) United States Patent
Shimamune et al.

(10) Patent No.: US 8,164,085 B2
(45) Date of Patent: Apr. 24, 2012

(54) SEMICONDUCTOR DEVICE AND PRODUCTION METHOD THEREOF

(75) Inventors: Yosuke Shimamune, Kawasaki (JP); Hiroyuki Ohta, Kawasaki (JP); Akiyoshi Hatada, Kawasaki (JP); Akira Katakami, Kawasaki (JP); Naoyoshi Tamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/916,953

(22) Filed: Nov. 1, 2010

(65) Prior Publication Data

US 2011/0049533 A1 Mar. 3, 2011

Related U.S. Application Data

(60) Continuation of application No. 12/458,621, filed on Jul. 17, 2009, now Pat. No. 7,875,521, which is a division of application No. 11/229,745, filed on Sep. 20, 2005, now Pat. No. 7,579,617.

(30) Foreign Application Priority Data

Jun. 22, 2005 (JP) ................................. 2005-182382

(51) Int. Cl.
*H01L 29/06* (2006.01)
(52) U.S. Cl. ............ 257/18; 257/19; 257/527; 257/529; 257/E21.634; 257/E21.636; 257/E21.637; 257/E21.64; 438/300; 438/303
(58) Field of Classification Search .................. None
See application file for complete search history.

(56) References Cited

U.S. PATENT DOCUMENTS

| 6,121,100 A * | 9/2000 | Andideh et al. .............. 438/305 |
| 6,335,251 B2 | 1/2002 | Miyano et al. |
| 6,368,927 B1 | 4/2002 | Lee |
| 6,451,704 B1 * | 9/2002 | Pradeep et al. .............. 438/719 |
| 6,593,618 B2 | 7/2003 | Kamata et al. |
| 6,621,131 B2 | 9/2003 | Murthy et al. |
| 6,921,913 B2 | 7/2005 | Yeo et al. |

(Continued)

FOREIGN PATENT DOCUMENTS

JP 2000-323711 A 11/2000

(Continued)

OTHER PUBLICATIONS

Ozturk et al., "Ultra-Shallow Source/Drain Junction for Nanoscale CMOS Using Selective Silicon Germanium Technology," International Workshop on Junction Technology, Nov. 29-30, 2001, pp. 5-1-1 to 5-1-6, 77.

(Continued)

*Primary Examiner* — Alexander Ghyka
*Assistant Examiner* — Yasser Abdelaziez
(74) *Attorney, Agent, or Firm* — Westerman, Hattori, Daniels & Adrian, LLP

(57) ABSTRACT

A method of fabricating a semiconductor device is disclosed that is able to suppress a short channel effect and improve carrier mobility. In the method, trenches are formed in a silicon substrate corresponding to a source region and a drain region. When epitaxially growing p-type semiconductor mixed crystal layers to fill up the trenches, the surfaces of the trenches are demarcated by facets, and extended portions of the semiconductor mixed crystal layers are formed between bottom surfaces of second side wall insulating films and a surface of the silicon substrate, and extended portion are in contact with a source extension region and a drain extension region.

15 Claims, 21 Drawing Sheets

U.S. PATENT DOCUMENTS

| | | | |
|---|---|---|---|
| 2003/0098479 A1 | 5/2003 | Murthy et al. | |
| 2003/0136985 A1 | 7/2003 | Murthy et al. | |
| 2003/0235966 A1 | 12/2003 | Kim et al. | |
| 2004/0262683 A1 | 12/2004 | Bohr et al. | |
| 2005/0006637 A1 | 1/2005 | Iinuma et al. | |
| 2005/0026367 A1* | 2/2005 | Streck et al. | 438/259 |
| 2005/0112817 A1 | 5/2005 | Cheng et al. | |
| 2005/0285203 A1* | 12/2005 | Fukutome et al. | 257/368 |
| 2005/0287752 A1* | 12/2005 | Nouri et al. | 438/303 |
| 2006/0138398 A1 | 6/2006 | Shimamune et al. | |
| 2006/0151776 A1 | 7/2006 | Hatada et al. | |
| 2006/0197164 A1 | 9/2006 | Lindert et al. | |
| 2006/0202278 A1 | 9/2006 | Shima et al. | |

FOREIGN PATENT DOCUMENTS

| | | |
|---|---|---|
| JP | 2002-231942 A | 8/2002 |
| JP | 2002-530864 A | 9/2002 |
| JP | 2004-31753 A | 1/2004 |
| WO | 00/30169 A1 | 5/2000 |

OTHER PUBLICATIONS

Quirk et al., Semiconductor Manufacturing Technology, 2001, p. 215.

Scott E. Thompson et al., "A 90-nm Logic Technology Featuring Strained-Silicon", IEEE Transactions on Electron Devices, Nov. 2004, pp. 1790-1797, vol. 51, No. 11.

U.S. Office Action dated May 28, 2009, issued in corresponding U.S. Appl. No. 11/471,732.

U.S. Office Action dated Jun. 11, 2010, issued in corresponding U.S. Appl. No. 12/698,303.

* cited by examiner

SEMICONDUCTOR DEVICE AND PRODUCTION METHOD THEREOF

CROSS-REFERENCE TO RELATED APPLICATION

This application is a continuation of U.S. application Ser. No. 12/458,621, filed on Jul. 17, 2009, which is a divisional of U.S. Pat. No. 7,579,617, issued on Aug. 25, 2009, which is based on Japanese Priority Patent Application No. 2005-182382 filed on Jun. 22, 2005, the entire contents of which are hereby incorporated by reference.

BACKGROUND OF THE INVENTION

1. Field of the Invention

The present invention generally relates to a semiconductor device and a method of producing the semiconductor device, and particularly, to a semiconductor device having a high operating speed due to stress application, and a method of producing the semiconductor device.

2. Description of the Related Art

A semiconductor device is made at a smaller and smaller scale in order to increase its operating speed and expand its functions, and so far, large scale integrated circuits (LSI) including transistors having a gate length less than 100 nm have been fabricated. When a transistor is miniaturized following a scaling rule more and more, the operating speed of the semiconductor device increases accordingly. However, when the gate length becomes extremely short, a threshold voltage decreases, namely, a so-called "short channel" effect occurs. Various methods are proposed to reduce the short channel effect, but effects of these methods are becoming more and more limited.

On the other hand, since mobility of holes is lower than mobility of electrons in silicon, it has been a crucial issue in the related art to increase the operating speed of a p-channel MOS (Metal-Oxide-Silicon) transistor, in which holes serve as carriers.

The p-channel MOS transistor is a component of a CMOS (Complementary MOS) inverter circuit, which is a basic element of a logic circuit. Hence, if the p-channel MOS transistor cannot operate at high speed, speed of the CMOS inverter circuit cannot be increased, either, and in turn, speed of the LSI cannot be increased.

A method is well know for improving hole mobility by applying a compressive stress to a channel region of a silicon substrate.

FIG. 1 is a cross-sectional view of a p-channel MOS transistor 100 involving compressive stress.

As shown in FIG. 1, a gate electrode 103 is arranged on a silicon substrate 101 with a gate insulating film 102 in between. On side walls of the gate electrode 103, side-wall insulating films 104A and 104B are provided to cover the surface of the silicon substrate 101.

In the silicon substrate 101, a channel region is formed beneath the gate electrode 103. In addition, in the silicon substrate 101, a source extension region 101A and a drain extension region 101B, in which p-type impurity elements are implanted, are formed on the two sides of the gate electrode 103. Further, a source region 101S and a drain region 101D, in which p-type impurity elements are implanted, are formed outside the source extension region 101A and the drain extension region 101B. Holes move from the source region 101S, and pass through the source extension region 101A, the channel region, and the drain extension region 101B, and finally arrive at the drain region 101D. Magnitude of a current of the holes is controlled by a gate voltage applied to the gate electrode 103 in the channel region.

Further, in the p-channel MOS transistor 100, SiGe mixed crystal layers 105A and 105B are formed in regions outside the side-wall insulating films 104A and 104B in the silicon substrate 101. The SiGe mixed crystal layers 105A and 105B are formed in the silicon substrate 101 by epitaxial growth. Because the lattice constant of the SiGe mixed crystal layers 105A and 105B is greater than the lattice constant of the silicon substrate 101, a compressive stress is induced in the SiGe mixed crystal layers 105A and 105B in a horizontal direction as indicated by arrows "a" in FIG. 1. Due to the compressive stress, lattices of the SiGe mixed crystal layers 105A and 105B stretch in a vertical direction as indicated by an arrow "b" in FIG. 1, namely, distortion of the lattices occurs.

Due to this distortion, in the channel region of the silicon substrate 101, which is sandwiched by the SiGe mixed crystal layers 105A and 105B, the lattice of the silicon substrate 101 stretches in the vertical direction as indicated by an arrow "c" in FIG. 1, in response to the stretch of the lattices of the SiGe mixed crystal layers 105A and 105B. As a result, in the channel region of the silicon substrate 101, a uniaxial compressive stress is induced in the horizontal direction as indicated by arrows "d" in FIG. 1.

In the p-channel MOS transistor 100 shown in FIG. 1, because of the uniaxial compressive stress in the channel region, symmetry of the silicon crystal in the channel region is locally modulated. In response to the change of the symmetry in the channel region, the degeneracy of heavy-hole valence bands and light-hole valence bands is removed. As a result, the hole mobility increases in the channel region, and the operating speed of a transistor rises. Particularly, the increase in hole mobility due to the compressive stress locally induced in the channel region and increase in transistor operating speed are significant in a transistor having a gate length less than 100 nm. For example, reference can be made to U.S. Pat. No. 6,621,131 (below, referred to as "reference 1") for details of the technique.

SUMMARY OF THE INVENTION

It is a general object of the present invention to solve one or more of the problems of the related art.

It is a more specific object of the present invention to provide a semiconductor device able to suppress a short channel effect and improve carrier mobility, and a method of producing the semiconductor device.

According to a first aspect of the present invention, there is provided a semiconductor device, including: a silicon substrate having a channel region; a gate electrode formed on the silicon substrate corresponding to the channel region with a gate insulating film in between; a first side wall insulating film formed on side walls of the gate electrode; a second side wall insulating film formed on side surfaces of the first side wall; a source extension region and a drain extension region formed from diffusion regions having a predetermined conductivity, said diffusion regions being formed in the silicon substrate on sides of the gate electrode to sandwich the channel region; a source region and a drain region formed from diffusion regions having the predetermined conductivity, said diffusion regions being formed in the silicon substrate outside the second side wall insulating film and in contact with the source extension region and the drain extension region, respectively; and a semiconductor mixed crystal layer formed in the silicon substrate outside the second side wall insulating film and epitaxially growing on the silicon substrate, wherein the semiconductor mixed crystal layer is formed from a SiGe mixed crystal when the predetermined conductivity is p-type, or from a SiC mixed crystal when the predetermined conductivity is n-type, the semiconductor mixed crystal layer includes an impurity having the predetermined conductivity, the semiconductor mixed crystal layer is grown to a height different from an interface between the silicon substrate and the gate insulating film, and the semiconductor mixed crystal layer has an extended portion between a bottom surface of the second side wall insulating film and a surface of the silicon substrate, said extended portion being in contact with a portion of the source extension region and the drain extension region.

According to the present invention, because a semiconductor mixed crystal layer having a predetermined conductivity is epitaxially grown on the sides of the channel region, a uniaxial stress is induced in the channel region, and this improves greatly the mobility of carriers through the channel region.

In addition, because the semiconductor mixed crystal layer has an extended portion, which is located between a bottom surface of the second side wall insulating film and a surface of the silicon substrate, and is in contact with a portion of one of the source extension region and the drain extension region, according to research of the inventors of the present invention, the extended portion of the semiconductor mixed crystal layer induces a stress opposite to the uniaxial stress within the substrate plane in the silicon substrate just below the semiconductor mixed crystal layer, and indirectly induces a stress in the same direction as the uniaxial stress on the silicon crystal in the channel region. Because this stress is in the same direction as the uniaxial stress, it tends to increase the stress in the channel region, and this further increases the mobility of the carriers.

For example, when the semiconductor device is a p-channel MOS transistor, the semiconductor mixed crystal layer is formed from a SiGe mixed crystal layer, and a compressive stress is applied from the SiGe mixed crystal layer on the two sides of the channel region to the channel region along a moving direction of holes. Because the extended portion of the SiGe mixed crystal layer is in contact with a portion of the source extension region or the drain extension region, which are in proximity of the source region and the drain region, the extended portion of the SiGe mixed crystal layer applies a stretching stress on the source extension region or the drain extension region. In this case, because the side surfaces of the source region and the drain region are fixed by the SiGe mixed crystal layer, the extended portion of the SiGe mixed crystal layer induces stretched deformation in the source extension region and the drain extension region in contact with the extended portion, and the stretching deformation generates an opposite stress in the silicon crystal in the channel region not in contact with the SiGe mixed crystal layer. As a result, it is possible to effectively apply the compressive stress on the channel region together with the deformation generated by the SiGe mixed crystal layer in the source and drain regions. This further increases the mobility of the carriers.

On the other hand, when the semiconductor device is an n-channel MOS transistor, the semiconductor mixed crystal layer is formed from a SiC mixed crystal layer, and a stretching stress is induced on the channel region along the moving direction of electrons. In this case, because of the extended portion of the SiC mixed crystal layer, a compressive stress is applied on the source extension region and the drain extension region close to the channel region, and it is possible to effectively apply the stretching stress on the channel region, and to further increases the mobility of electrons in the channel region.

Further, because the semiconductor mixed crystal layer includes conductive impurities and is in contact with a portion of one of the source extension region and the drain extension region, stray resistance can be reduced greatly, and this can improve a driving current of the semiconductor device.

According to a second aspect of the present invention, there is provided a method of fabricating a semiconductor device including semiconductor mixed crystal layers on sides of a channel region for inducing a stress in the channel region, comprising the steps of: forming a gate insulating film on the silicon substrate; forming a gate electrode on the silicon substrate in correspondence to the channel region with the gate insulating film in between; forming first diffusion regions in the silicon substrate on respective sides of the gate electrode and having a predetermined conductivity; forming a first side wall insulating film on side walls of the gate insulating film and the gate electrode, a portion of the first side wall insulating film extending on the silicon substrate; forming a second side wall insulating film on side surfaces of the first side wall; forming second diffusion regions in the silicon substrate outside the second side wall insulating film and having the predetermined conductivity, said second diffusion regions forming a source region and a drain region; forming, by etching, trenches in the silicon substrate corresponding to the source region and the drain region so that side surfaces and bottom surfaces of the trenches are continuously covered by the second diffusion regions, said trenches having side surfaces defined by facets; removing a portion of the first side wall insulating film; growing the semiconductor mixed crystal layer by epitaxial growth to fill up the trenches, said semiconductor mixed crystal layers being grown to a height different from an interface between the silicon substrate and the gate insulating film, wherein in the step of removing, a portion of the first side wall insulating film between a bottom surface of the second side wall insulating film and a surface of the silicon substrate is removed to form a space, and in the step of growing the semiconductor mixed crystal layers, the semiconductor mixed crystal layers fill up the space.

According to the present invention, trenches are formed, and after a portion of the first side wall insulating film between a bottom surface of the second side wall insulating film and a surface of the silicon substrate is removed and a space is formed, the semiconductor mixed crystal layers are grown epitaxially to fill up the trenches and the space.

The semiconductor mixed crystal layers grow from the surface of the silicon substrate in the space, the semiconductor mixed crystal layers fill up the space, and grow along the second side wall insulating film. Hence, in the processing with HF, the semiconductor mixed crystal layers and the second side wall insulating film are in close contact, and the space is filled up. This prevents HF from entering the space between the semiconductor mixed crystal layers and the second side wall insulating film, and prevents the first side wall insulating film from being directly exposed. As a result, it is possible to prevent the first side wall insulating film from being partially removed to expose the silicon substrate, and in a step of forming a silicide layer, it is possible to prevent the silicide layer from damaging, like a spike, the silicon substrate.

These and other objects, features, and advantages of the present invention will become more apparent from the fol-

DESCRIPTION OF THE PREFERRED EMBODIMENTS

Below, preferred embodiments of the present invention are explained with reference to the accompanying drawings.

Inventors of the present invention found new technical subject matter as below, which has not been disclosed so far.

Figure 1:
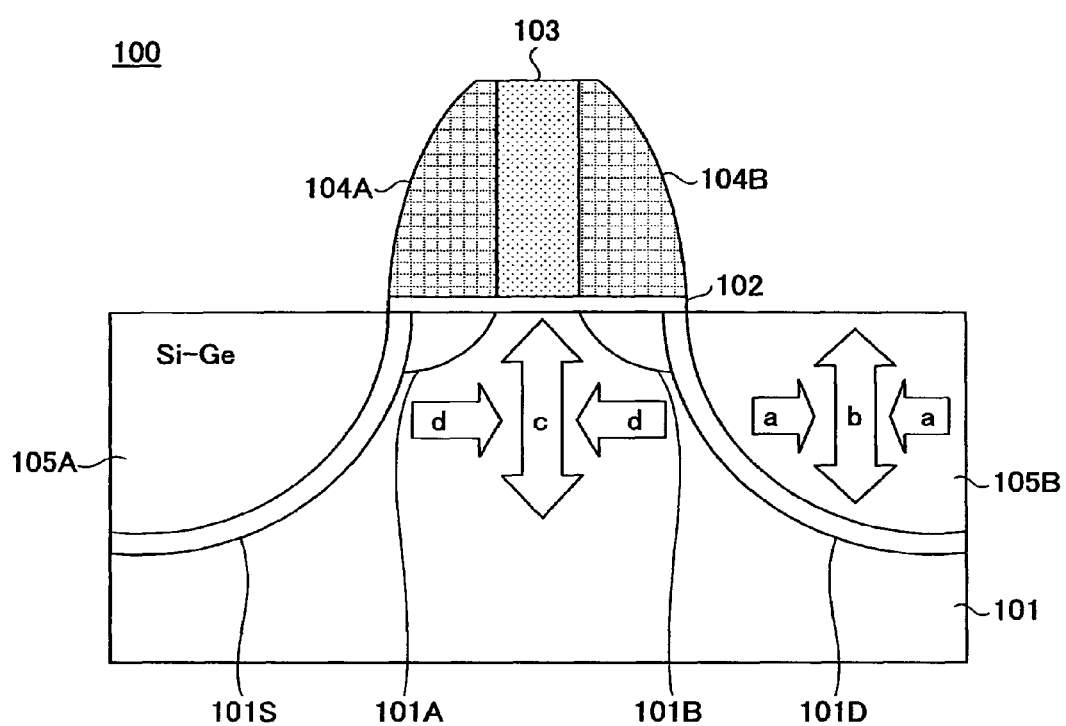
FIG. 1 is a cross-sectional view of a p-channel MOS transistor 100 involving compressive stress.

It is known that when the compressive stress induced in the channel region of a transistor increases, the hole mobility in the channel region rises and a driving current of the transistor increases. Nevertheless, in the p-channel MOS transistor 100 as shown in FIG. 1, when the interval between the SiGe mixed crystal layers 105A and 105B is large, the vertical stretch at the center of the channel region of the silicon substrate 101 becomes small, and due to this, a sufficiently large compressive stress cannot be induced in the channel region. In order to increase the compressive stress, it is effective to reduce the interval between the SiGe mixed crystal layers 105A and 105B.

However, in a transistor having an extremely short gate length, the source extension region 101A and the drain extension region 101B on the two sides of the channel region, and non-illustrated pocket regions formed on the inside of the source extension region 101A and the drain extension region 101B have functions of suppressing the short channel effect. Because the SiGe mixed crystal layers 105A and 105B are formed after implanting impurities into the source extension region 101A, the drain extension region 101B, and the pocket regions, it is necessary to form trenches in proximity of these impurity regions. Hence, when it is attempted to reduce the interval between the SiGe mixed crystal layers 105A and 105B, when forming the trenches, impurity profiles are disturbed, roll-off characteristics of a threshold voltage is degraded, and a leakage current rises, namely, the short channel effect occurs.

In other words, when it is attempted to increase the compressive stress and thus increase the driving current by reducing the interval between the SiGe mixed crystal layers 105A and 105B, trade-off with suppression of the short channel effect should be considered.

For example, this issue is discussed in "S. E. Thompson et al., IEEE Transactions on Electrons Devices, Vol. 51, No. 11, November, 2004, pp. 1790-1797" (below, referred to as "reference 2").

Figure 2:
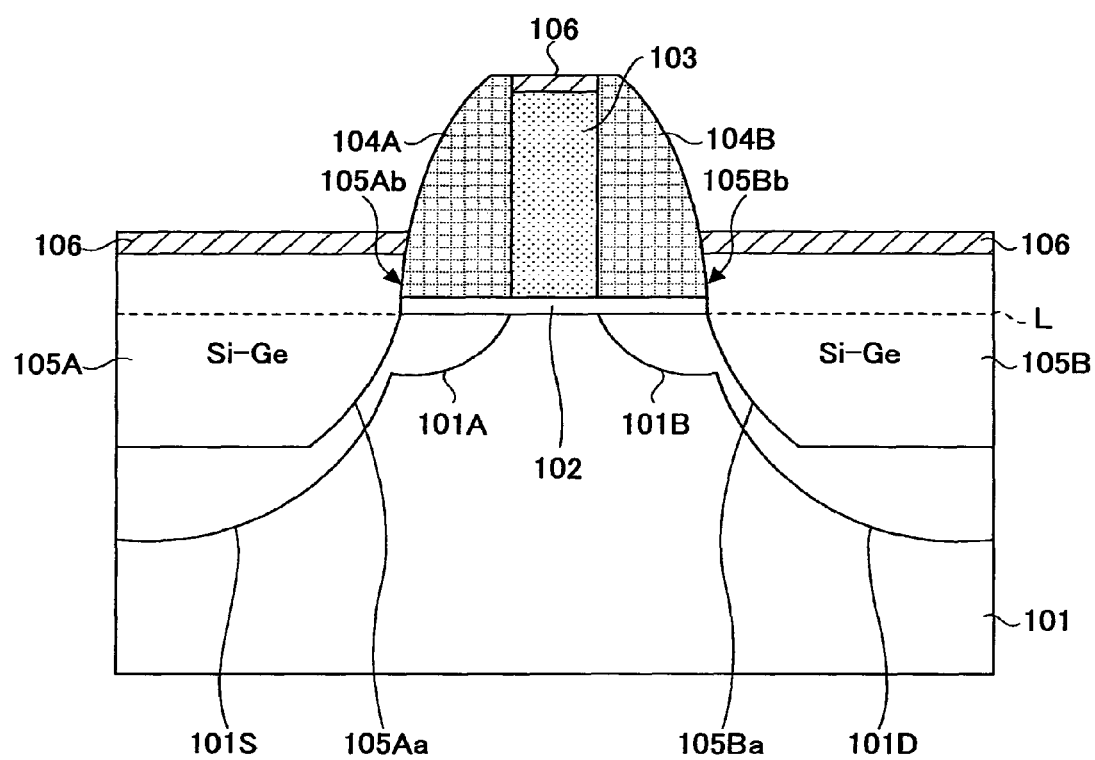
FIG. 2 is a cross-sectional view of a MOS transistor disclosed in reference 2.

FIG. 2 is a cross-sectional view of a MOS transistor disclosed in reference 2.

The MOS transistor is a modification of the MOS transistor 100 in FIG. 1, therefore, the same reference numbers are assigned to the same elements as those in FIG. 1, and overlapping descriptions are omitted.

As illustrated in FIG. 2, the SiGe mixed crystal layers 105A and 105B are epitaxially grown again to fill up trenches 105Aa and 105Ba formed in the silicon substrate 101 up to a height L indicated by a dotted line in FIG. 2. As illustrated in FIG. 2, the height L is higher than the interface between the silicon substrate 101 and the gate insulating film 102.

In FIG. 2, a silicide layer 106 is formed on the SiGe mixed crystal layers 105A and 105B; in fact, a nickel silicide layer is used in 90-nm or sub-90-nm semiconductor devices. When forming the nickel silicide layer, pre-processing is performed with HF (hydrofluoric acid) to remove the native oxide films on surfaces of the SiGe mixed crystal layers 105A and 105B. In this process, if there exist spaces between the SiGe mixed crystal layers 105A and 105B and outer surfaces of the side-wall insulating films 104A and 104B due to facets of the SiGe mixed crystal layers 105A and 105B, the gate insulating film 102, or the side-wall insulating films 104A and 104B, which are formed from silicon oxide films, are dissolved by HF, and part of the surface of the silicon substrate 101 ends up being exposed. If the silicide layer 106 is formed under such conditions, the silicide layer 106 may destroy, like a spike, the pn junction formed between the source extension region 101A and the drain extension region 101B and the n-type silicon substrate 101, and extend to the n-well region of the silicon substrate 101, which causes strong junction leakage.

As described in the following embodiments, the present invention provides a semiconductor device and a method of producing the semiconductor device to solve these problems.

First Embodiment

Figure 3:
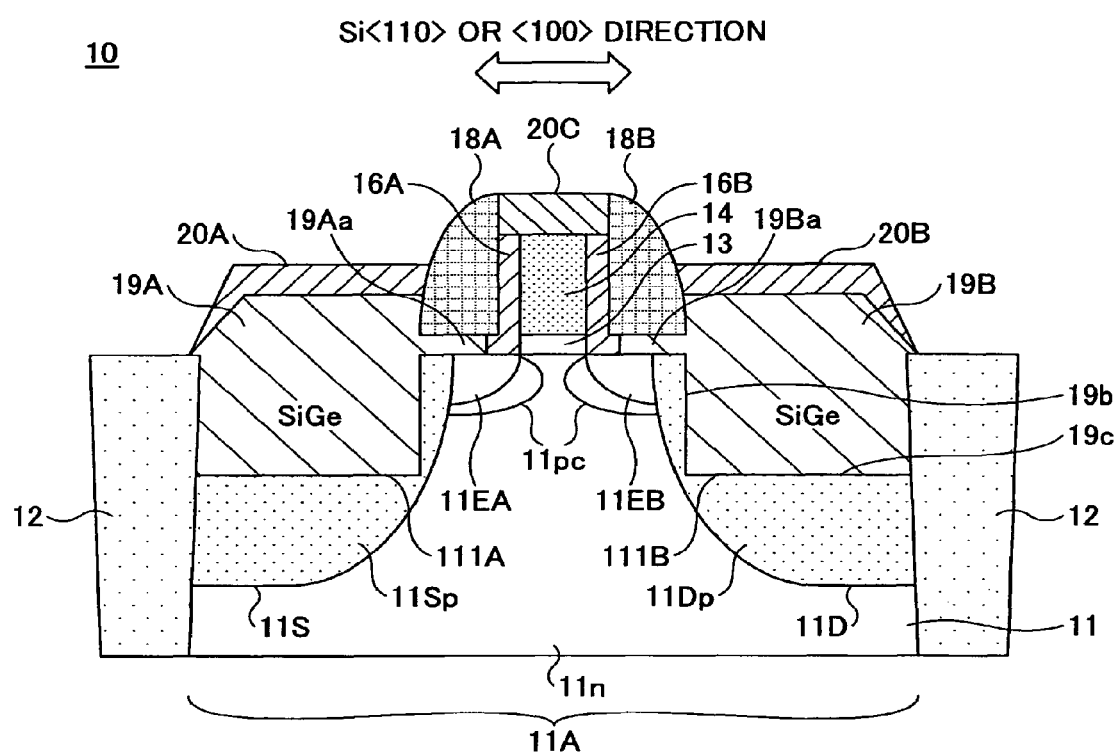
FIG. 3 is a cross-sectional view illustrating an example of a semiconductor device according to a first embodiment of the present invention.

FIG. 3 is a cross-sectional view illustrating an example of a semiconductor device according to a first embodiment of the present invention.

The semiconductor device 10 shown in FIG. 3 is a p-channel MOS transistor, in which a device region 11A demarcated by an element separation region 12 is formed on a single crystal silicon substrate 11 having a (100) crystal plane as a principal plane. Corresponding to the device region 11A, which is an n-type semiconductor region, an n-type Si well 11n is formed in the silicon substrate 11.

On the silicon substrate 11 including the n-type device region 11A, a gate insulating film 13 is formed on the silicon substrate corresponding to a channel region in the silicon substrate. For example, the gate insulating film 13 may be formed from a thermal oxide film, a silicon nitride film, a silicon oxide nitride film, or others. In this example, it is assumed that the gate insulating film 13 is formed from a silicon oxide nitride film having a thickness of 1.2 nm.

On the gate insulating film 13, a gate electrode 14 is formed from a poly-silicon film including boron (B) or other p-type impurities.

On side-walls of the laminated structure of the gate insulating film 13 and the gate electrode 14, first side wall insulating films 16A and 16B are formed, for example, from a silicon oxide film by CVD. The first side wall insulating films 16A and 16B cover portions of the silicon substrate besides the gate insulating film 13, and cover the side-walls of the laminated structure of the gate insulating film 13 and the gate electrode 14.

Second side-wall insulating films 18A and 18B are formed on side surfaces of the first side walls 16A and 16B, for example, from a silicon nitride film.

In the silicon substrate 11, trenches 111A and 111B are formed outside the second side-wall insulating films 18A and 18B, respectively. SiGe mixed crystal layers 19A and 19B including p-type impurities are grown epitaxially in the trenches 111A and 111B to fill up the trenches 111A and 111B, respectively. The SiGe mixed crystal layers 19A and 19B epitaxially grown on the silicon substrate 11 have lattice constants greater than the silicon substrate 11, and as described above with reference to FIG. 1, a uniaxial compressive stress is applied on the channel region just below the gate electrode 14 in the silicon substrate 11. The second side wall insulating films 18A and 18B cover portions of the SiGe mixed crystal layers 19A and 19B, and cover the side surfaces of the first side walls 16A and 16B.

In the p-channel MOS transistor 10 shown in FIG. 3, n-type pocket implanted regions 11pc are formed in the device region 11A on two sides of the gate electrode 13. For example, the n-type pocket implanted regions 11pc are formed from Sb or other n-type impurities which are implanted obliquely. Further, a source extension region 11EA and a drain extension region 11EB are formed to partially overlap the n-type pocket implanted regions 11pc.

The source extension region 11EA and drain extension region 11EB are of p-type, and in contact with p-type diffusion regions 11Sp and 11Dp, respectively, which form a source region 11S and a drain region 11D of the p-channel MOS transistor 10, respectively. The p-type diffusion regions 11Sp and 11Dp enclose the SiGe mixed crystal layers 19A and 19B, respectively, which are portions of the source region 11S and the drain region 11D. Due to this structure, the p-type SiGe mixed crystal layers 19A and 19B having a small band-gap do not directly contact the n-type well 11n, and this reduces a leakage current in a pn junction at the interface between Si and SiGe.

Silicide layers 20A and 20B are formed on the SiGe mixed crystal layers 19A and 19B, respectively, and a silicide layer 20C is formed on the gate electrode 13. Because the silicide layers 20A, 20B, and 20C are actually reaction products between metals and the SiGe mixed crystal layers 19A and 19B, the silicide layers 20A, 20B, and 20C include metal-germano-silicide and metal-silicide. Below, for descriptive convenience, it is simply described that the silicide layers 20A, 20B, and 20C are formed from "silicide".

Although not illustrated, a silicon layer including p-type impurities are formed on the SiGe mixed crystal layers 19A and 19B, and a silicide layer may be formed on the silicon layer, that is, converting the surface of the silicon layer into silicide. This Ge-free silicide layer is superior in thermal resistance compared to the above silicide layers which consume the SiGe mixed crystal layers 19A and 19B directly.

In the p-channel MOS transistor 10 shown in FIG. 3, each of the SiGe mixed crystal layers 19A and 19B has a side surface 19b and a bottom surface 19c, which demarcate the SiGe mixed crystal layers 19A and 19B. The side surface 19b or the bottom surface 19c is a flat facet. The bottom surface 19c is in a (100) plane parallel to the principal plane of the silicon substrate 11, and the side surface 19b is nearly perpendicular to the bottom surface 19c. Due to this, the side surface 19b of the SiGe mixed crystal layer 19A and the side surface 19b of the SiGe mixed crystal layer 19B, which face each other, are nearly perpendicular to the principal plane of the silicon substrate 11, and this structure can effectively confine the uniaxial compressive stress in the channel region.

Preferably, the concentration of Ge in the SiGe mixed crystal layers 19A and 19B is in a range from 20 atom % to 40 atom %, because with the concentration of Ge greater than 20 atom %, a strong compressive stress can be imposed on the channel region, and dislocation defects are preventable on the interface between the silicon substrate 11 and the SiGe mixed crystal layers 19A and 19B.

According to experimental results in the present invention, in the device region 11A of the semiconductor device, it is found that even when the thickness of the semiconductor layer constituting the SiGe mixed crystal layers 19A and 19B, which are formed in regions having limited areas, grows to be greater than a so-called critical film thickness, sometimes, quality of the growing semiconductor layer does not deteriorate. This is different from a model of two-dimensional continuous epitaxial growth. In addition, it is found that even when the concentration of Ge is increased to be higher than a critical concentration, and it is thought that this critical concentration may cause dislocation defects, sometimes, quality of the growing semiconductor layer does not deteriorate. Further, it is found that the effective critical film thickness increases when the growing temperature is lowered, and in the present invention, with thin films of the SiGe mixed crystal layers 19A and 19B, which are selectively grown locally at a low temperature, it is possible to effectively impose deformation on the channel. From this experiment, it is found that the SiGe mixed crystal layers 19A and 19B can be epitaxially grown when the concentration of Ge in the SiGe mixed crystal layers 19A and 19B is to be lower than or equal to 40 atom %.

It is known that in the SiGe mixed crystal layers 19A and 19B having a high Ge concentration, the solubility limit of Boron increases, and concentration of the impurities can be as high as $1 \times 10^{22}$ cm$^{-3}$. Concentration of the impurities in the SiGe mixed crystal layers 19A and 19B is set to be in a range from $1 \times 10^{19}$ cm$^{-3}$ to $1 \times 10^{21}$ cm$^{-3}$. Due to this, it is possible to reduce the resistance of the SiGe mixed crystal layers 19A and 19B.

The SiGe mixed crystal layers 19A and 19B have extended portions 19Aa, 19Ba, which are formed on the respective sides of the first side wall insulating films 16A and 16B below the bottom surface of the second side wall insulating films 18A, 18B and covering the surface of the silicon substrate 11. The extended portions 19Aa and 19Ba are in contact with the source extension region 11EA and the drain extension region 11EB, respectively. As described below, since the SiGe mixed crystal layers 19A and 19B are low resistance CVD films including p-type impurities of high activity, due to the extended portions 19Aa and 19Ba, stray resistance can be greatly reduced. As a result, the short channel effect does not occur, and the current driving capability of the p-channel MOS transistor 10 is improved.

The extended portions 19Aa and 19Ba are epitaxially grown on the silicon substrate 11 just below the extended portions 19Aa and 19Ba. In experiments performed in the present invention, the inventors of the present invention found that by deformation analysis by means of converged electron diffraction and corresponding high order diffracted electron beams, a stretching stress is imposed on the silicon substrate 11 just below the SiGe mixed crystal layers 19A and 19B in the gate length direction. Therefore, it is highly expected that the extended portions 19Aa and 19Ba induce a stretching stress in the gate length direction in the silicon substrate 11 just below the extended portions 19Aa and 19Ba. In this case, because the side surfaces 19b are fixed by the SiGe mixed crystal layers 19A and 19B, it is believed that the extended portions of the SiGe mixed crystal layers 19A and 19B induce stretching deformation in the source extension region 11EA and the drain extension region 11EB, and the stretching deformation generates stress opposite to the silicon crystal in the channel region. As a result, in the p-channel MOS transistor 10 shown in FIG. 3, because of the extended portions 19Aa and 19Ba, which are in contact with the source extension region 11EA and the drain extension region 11EB, it is possible to further increases the hole mobility.

The extended portions 19Aa and 19Ba are formed to fill up a space between the second side wall insulating films 18A and 18B and the surface of the silicon substrate 11. In addition, because of the extended portions 19Aa and 19Ba, the SiGe mixed crystal layers 19A and 19B grow continuously on outer surfaces of the second side wall insulating films 18A and 18B from the extended portions 19Aa and 19Ba. Therefore, the SiGe mixed crystal layers 19A and 19B are in close contact with the second side wall insulating films 18A and 18B, and the extended portions 19Aa and 19Ba of the SiGe mixed crystal layers 19A and 19B cover ends of the first side wall insulating films 16A and 16B. Consequently, during HF processing in a step of forming a silicide film, the first side wall insulating films 16A and 16B are not eroded, and it is possible to prevent a silicide spike from being formed in the silicon substrate 11. Especially, when nickel is used to form the silicide layer, it is difficult to induce a silicide reaction of nickel on SiGe compared to a silicide reaction on Si. However, because of the extended portions 19Aa and 19Ba, it is possible to effectively prevent nickel from being diffused to the source extension region 11EA and the drain extension region 11EB. Consequently, it is possible to prevent direct contact of the silicide layers 20A and 20B with the n-well 11n, and reduce the leakage current.

It is preferable that the extended portions 19Aa and 19Ba be at a distance from the channel region and the gate insulating film 13 just above the channel region. The reasons are described below. When the extended portions 19Aa and 19Ba of the SiGe mixed crystal layers 19A and 19B are in proximity of the channel region and the gate insulating film 13 just above the channel region, Ge atoms in the SiGe mixed crystal layers 19A and 19B diffuse in the channel region in a heat treatment in subsequent processing, and probably cause spread of the channel current. In addition, Ge atoms in the SiGe mixed crystal layers 19A and 19B may diffuse into the gate insulating film 13, and lower reliability of the gate insulating film 13. Considering stray resistance, or magnitude of the stress, protection to the first side wall insulating films 16A and 16B during a HF treatment, and device degradation due to diffusion of Ge atoms, the longitudinal length of the extended portions 19Aa and 19Ba, and the distances between the extended portions 19Aa and 19Ba and the gate insulating film 13 are appropriately determined.

The SiGe mixed crystal layers 19A and 19B are grown to be higher than the interface between the silicon substrate and the gate insulating film 13 by 5 nm to 40 nm. Due to this, it is possible to effectively induce the compressive stress.

When the silicide layers 20A and 20B are formed from nickel silicide, because generally the nickel silicide layers induce a stretching stress on the channel, this stretching stress tends to cancel out the compressive stress. However, because the silicide layers 20A and 20B are formed on the SiGe mixed crystal layers 19A and 19B, and at positions much higher than the interface between the silicon substrate and the gate insulating film 13, the stretching stress induced in the silicide layers 20A and 20B cannot cancel out the compressive stress induced in the channel region.

It is preferable that the gate electrode 14 extend on the silicon substrate 11 nearly in the direction <110>, but the gate electrode 14 may also extend nearly in the direction <100>.

In the p-channel MOS transistor 10 shown in FIG. 3, enhancement of hole mobility due to application of the compressive stress on the channel region is noticeable when the silicon substrate 11 is a so-called (100) substrate, and the gate length direction on the silicon substrate 11 is along the <110> direction or the <100> direction, especially, when in the <110> direction. Here, the <100> direction includes the [100] direction and directions equivalent to the [100] direction in a diamond structure. The same is true for the <110> direction.

Below, a method of fabricating the semiconductor device 10 in FIG. 3 is explained with reference to FIG. 4A through FIG. 4C, and FIG. 5A and FIG. 5B.

Figure 4A:
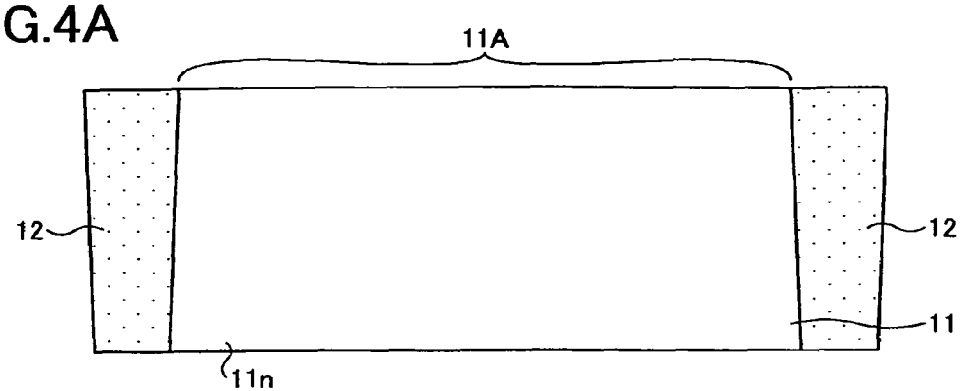
FIG. 4A through FIG. 4C are cross-sectional views illustrating portions of the semiconductor device 10 in FIG. 3 for illustrating a method of fabricating the semiconductor device 10 according to the present embodiment of the present invention.
Figure 4B:
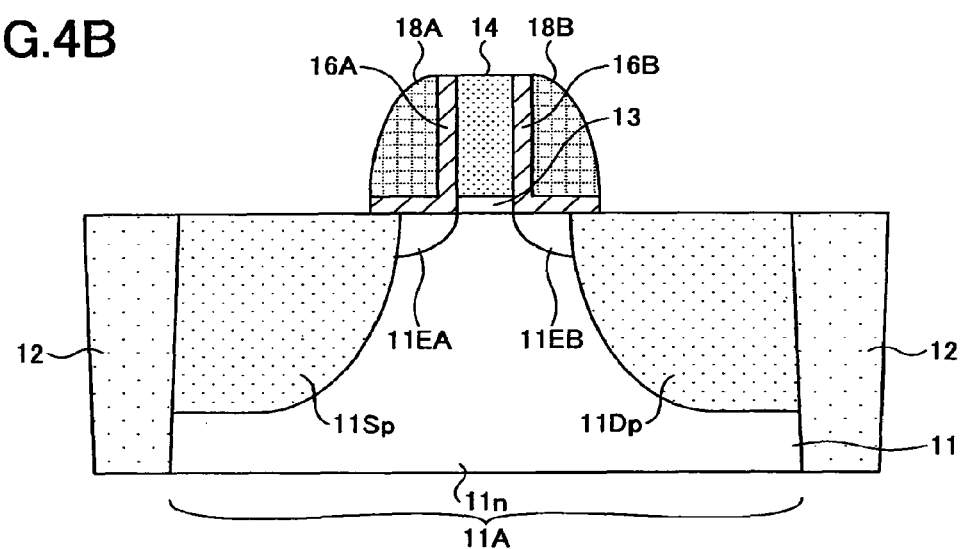
Figure 4C:
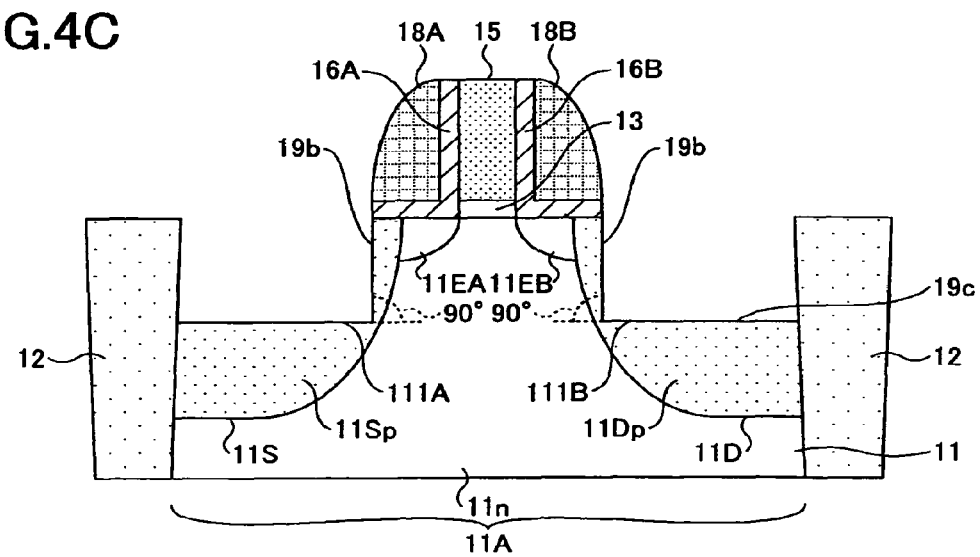

FIG. 4A through FIG. 4C are cross-sectional views illustrating portions of the semiconductor device 10 in FIG. 3 for illustrating a method of fabricating the semiconductor device 10 according to the present embodiment of the present invention.

In the step shown in FIG. 4A, on the p-type silicon substrate 11, the device region 11A is demarcated by the element separation region 12, which is a STI-type; n-type impurities are implanted into the device region 11A, thereby, the n-type Si well 11n is formed corresponding to the device region 11A.

Next, in the step shown in FIG. 4B, on the silicon substrate 11, corresponding to the device region 11A, the gate insulating film 13 and the gate electrode 14 are formed from patterning of a SiON film and a poly-silicon film, which are uniformly formed on the silicon substrate 11.

Then, with the gate electrode 14 as a mask, Sb or other n-type impurities are implanted obliquely in the device region 11A, thereby, forming the pocket regions llpc as shown in FIG. 3. In FIG. 4B and the subsequent drawings, the pocket regions 11pc are not illustrated.

Then, with the gate electrode 14 as a mask, boron (B) or other p-type impurities are implanted in the device region 11A, thereby forming the source extension region 11EA and the drain extension region 11EB.

Then, the first side walls 16A and 16B and the second side-wall insulating films 18A and 18B are formed on the gate electrode 14. Further, boron (B) or other p-type impurities are implanted, and p-type diffusion regions 11Sp and 11Dp are formed outside the second side-wall insulating films 18A and 18B in the device region 11A in the silicon substrate 11.

Next, in the step shown in FIG. 4C, in the silicon substrate 11, a portion of the device region 11A outside the second side-wall insulating films 18A and 18B is etched by dry etching to a depth of 10 to 60 nm. Due to the etching process, trenches 111A and 111B are formed in the device region 11A, which are demarcated by the side surface 19b nearly perpendicular to the principal plane of the silicon substrate 11 and the side surface 19c nearly parallel to the principal plane of the silicon substrate 11.

Figure 5A:
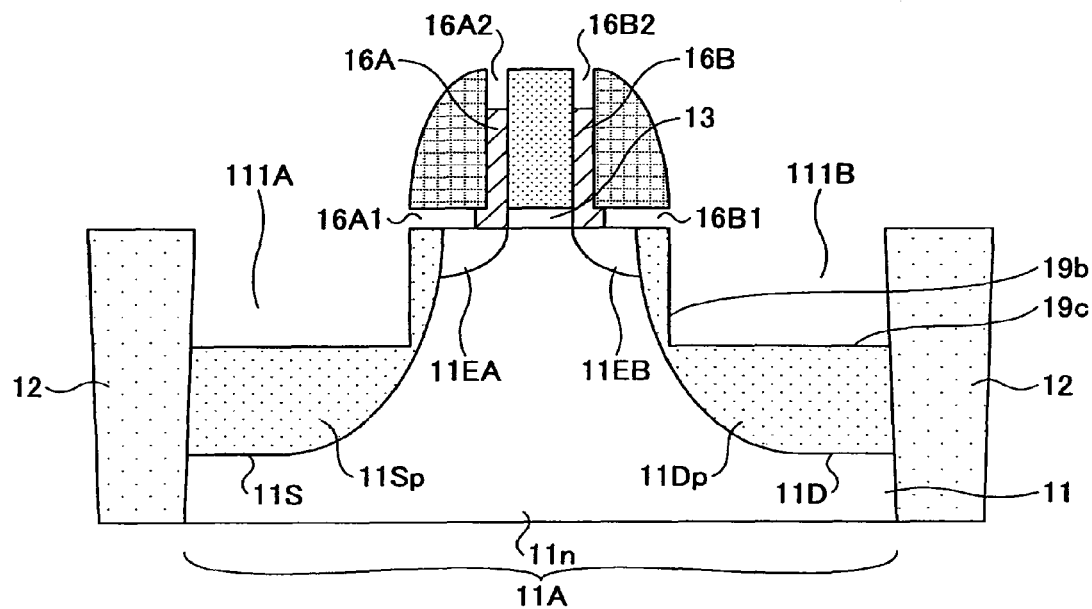
FIG. 5A and FIG. 5B are cross-sectional views illustrating portions of the semiconductor device 10 in FIG. 3 continuing from FIG. 4C for illustrating the method of fabricating the semiconductor device 10 of the present embodiment of the present invention.
Figure 5B:
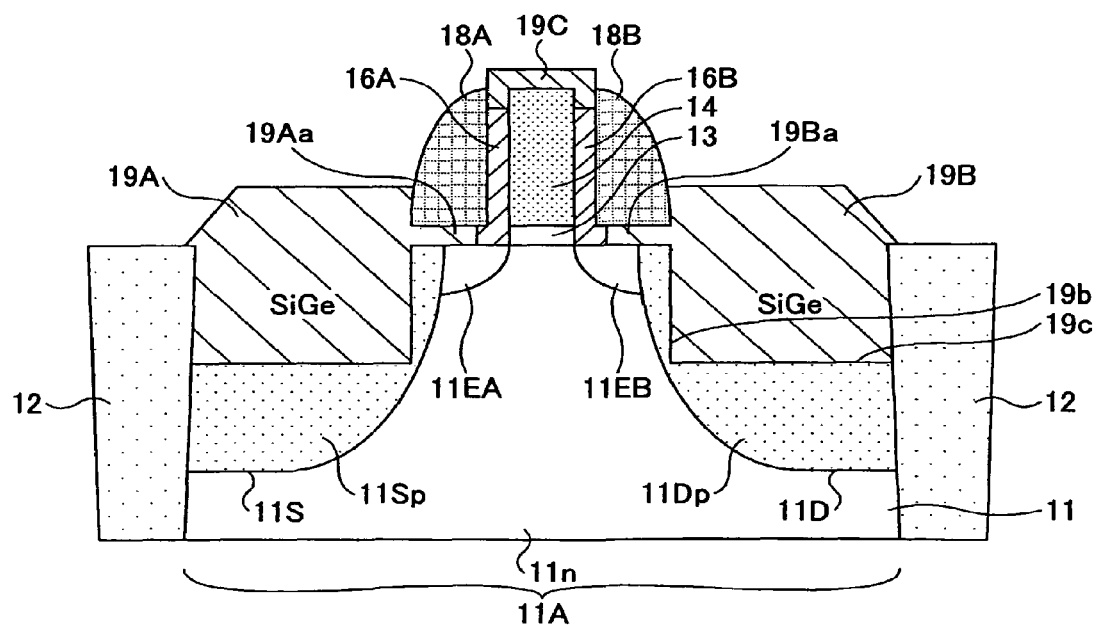

FIG. 5A and FIG. 5B are cross-sectional views illustrating portions of the semiconductor device 10 in FIG. 3 continuing from FIG. 4C for illustrating the method of fabricating the semiconductor device 10 of the present embodiment of the present invention.

In the step shown in FIG. 5A, portions of the first side wall insulating films 16A, 16B, which are formed from silicon oxide films, are removed by isotropic etching, and below the bottom surface of the second side wall insulating films 18A and 18B, the surface of the silicon substrate 11 is exposed, forming spaces 16A1 and 16B1, which are like slits along the gate width direction.

Here, in the isotropic etching, a water solution of HF (for example, the concentration of HF is 5 volume %) or HF vapor is used. Here, as long as the first side wall insulating films 16A, 16B can be selectively etched by the isotropic etching, there are no limitations to the conditions of the isotropic etching. During the isotropic etching, the first side wall insulating films 16A, 16B on the gate electrode 14 are also etched, and forming openings 16A2 and 16B2.

It is preferable that the spaces 16A1 and 16B1 be formed by the isotropic etching such that a large portion of the surface of the silicon substrate 11, on which the source extension region 11EA and the drain extension region 11EB are formed, are exposed through the spaces 16A1 and 16B1, and the spaces 16A1 and 16B1 do not reach the gate insulating film 13.

For example, in FIG. 5A, each of the first side wall insulating films 16A, 16B may be formed to be L-shaped, and cover side surfaces of the gate insulating film 13 and the gate electrode 14.

In the isotropic etching, the amount of the first side wall insulating films 16A, 16B to be removed is determined by the etching time or concentration of HF, and the isotropic etching is performed in such a way that the side surfaces of the gate insulating film 13 and the gate electrode 14 are not exposed.

In the isotropic etching, native oxide films on the trenches 111A and 111B are also removed.

Next, in the step shown in FIG. 5B, the substrate with the structure in FIG. 5A being formed thereon is introduced in a low pressure CVD device, which is filled with hydrogen gas, nitrogen gas, or argon gas, helium gas or other inactive gases, and is maintained at a pressure from 5 to 1330 Pa.

Then, after the temperature is increased to 400 to 550° C. in a hydrogen atmosphere, the pressure is maintained in a range from 5 to 1330 Pa for 5 minutes, to execute baking of the substrate in the hydrogen atmosphere.

Then, at a substrate temperature of 400 to 550° C., and with partial pressures of hydrogen gas, nitrogen gas, or argon gas, helium gas or other inactive gases being in a range from 5 to 1330 Pa, the following gases are supplied in a period from 1 to 40 minutes, that is, a silane ($SiH_4$) gas (as a gas-phase material of silicon) with the partial pressure in a range from 1 to 10 Pa, a germane ($GeH_4$) gas (as a gas-phase material of Ge) with the partial pressure in a range from 0.1 to 10 Pa, a diborane ($B_2H_6$) gas (as a dopant gas) with the partial pressure in a range from $1\times10^{-5}$ to $1\times10^{-3}$ Pa, and a HCl (hydrogen chloride) gas (as a precursor which enhances selectivity) with the partial pressure in a range from 1 to 10 Pa. Consequently, p-type SiGe mixed crystal layers 19A and 19B are epitaxially grown in the trenches 111A and 111B.

At the same time, the extended portions 19Aa, 19Ba of the SiGe mixed crystal layers 19A and 19B are formed in the spaces 16A1 and 16B1 below the bottom surfaces of the second side wall insulating films 18A, 18B. Further, the SiGe mixed crystal layers 19A and 19B grow upward while being in close contact with the side surfaces of the second side-wall insulating films 18A, 18B.

Next, after the step in FIG. 5B, the surfaces of the SiGe mixed crystal layers 19A and 19B are converted to silicide layers. Specifically, the surface of the structure in FIG. 5B is treated by using HF to remove native oxide films on the surface. Then, for example, a nickel film is formed by sputtering to cover the structure in FIG. 5B. Then, a RTP (Rapid Thermal Process) device is used to perform a heat treatment (at 400 to 500° C.) to induce reactions with the source region 19A, the drain region 19B, and a SiGe mixed crystal layer 19C on the gate electrode 14, for example, forming a nickel silicide layer (include germano-silicide) having a thickness of 20 nm.

Then, the un-reacted nickel film is etched by wet etching using a mixture of ammonia and hydrogen peroxide (first treatment), and is further etched by wet etching using a mixture of sulfuric acid and hydrogen peroxide (second treatment), thus the un-reacted nickel film is removed. Where necessary, one or more wet etching steps can be omitted. Then, where necessary, the RTP device is used to perform a heat treatment at 400 to 500° C.

Here, instead of the nickel silicide films, Co, Ta, Ti, or PT silicide films may be formed.

In this way, the p-channel MOS transistor 10 in FIG. 3 is fabricated.

In the method of the present embodiment, because the SiGe mixed crystal layers 19A and 19B are formed by CVD with p-type impurities as dopants, an activation rate of the impurities is nearly 100% even without a heat treatment. This rate is higher than the activation rate of the impurities implanted by ion implantation. Therefore, the SiGe mixed crystal layers 19A and 19B have low resistance, and the extended portions 19Aa and 19Ba are in contact with the source extension region 11EA and the drain extension region 11EB, respectively, so that the stray resistance can be reduced greatly, and the current driving capability of the p-channel MOS transistor 10 is improved.

In the step of forming a silicide film to remove the native oxide films on the SiGe mixed crystal layers 19A and 19B by treatment using HF, it is possible to prevent the extended portions 19Aa and 19Ba of the SiGe mixed crystal layers 19A and 19B from contacting the first side wall insulating films 16A and 16B; therefore, the first side wall insulating films 16A and 16B are not eroded, and the surface of the silicon substrate 11 is not exposed. Further, when the silicide layers are formed from nickel silicide, it is difficult to induce a silicide reaction of nickel on SiGe compared to a silicide reaction of nickel on Si. Hence, it is possible to prevent a silicide spike from being formed in the n-well 11n.

In the step shown in FIG. 5B, instead of the processing described above, at an initial stage of growth of the SiGe mixed crystal layers 19A and 19B, the partial pressure of the germane ($GeH_4$) gas (as a gas-phase material of Ge) may be set relatively low, and along with growth of the SiGe mixed crystal layers 19A and 19B, the partial pressure of the germane ($GeH_4$) gas may be increased successively. Due to this, it is possible to prevent dislocation in the interface between the silicon substrate 11 and the SiGe mixed crystal layers 19A and 19B, and effectively form horizontal compressive deformation inside the SiGe mixed crystal layers 19A and 19B.

After the step shown in FIG. 5B, before the step of forming a silicide film, p-type semiconductor layers primarily including Si may be deposited on the SiGe mixed crystal layers 19A and 19B. By siliciding a p-type semiconductor layer primarily including Si, it is possible to prevent degradation of thermal resistance or morphology, which occurs easily in siliciding process when the concentration of Ge is high in the SiGe mixed crystal layers 19A and 19B.

Specifically, at a temperature the same as or lower than that of the SiGe mixed crystal layers 19A and 19B, a silane ($SiH_4$) gas with a partial pressure in a range from 1 to 10 Pa, a diborane ($B_2H_6$) gas with a partial pressure in a range from $1\times10^{-4}$ to $1\times10^{-2}$ Pa, and a HCl (hydrogen chloride) gas with a partial pressure in a range from 1 to 10 Pa are supplied together, and a p-type semiconductor layer of a thickness less than 20 nm is formed on the SiGe mixed crystal layers 19A and 19B.

Because the p-type semiconductor layer is provided for consideration of the subsequent siliciding step, it is preferable that the p-type semiconductor layer be a p-type silicon layer which can be easily silicided, but the p-type semiconductor layer may include Ge of a concentration lower than the concentration of Ge in the SiGe mixed crystal layers 19A and 19B. When the p-type semiconductor layer includes Ge, in growth of the p-type semiconductor layer, a $GeHe_4$ gas with a partial pressure from 0 to 0.4 Pa may be supplied.

As described above, in the p-channel MOS transistor 10 in FIG. 3, because p-type SiGe mixed crystal layers 19A, 19B are epitaxially grown on the sides of the channel region, a uniaxial compressive stress is applied on the channel region. Because the side surface 19b of the SiGe mixed crystal layer 19A and the side surface 19b of the SiGe mixed crystal layer 19B, which face each other, are nearly perpendicular to the principal plane of the silicon substrate 11, it is possible to induce the compressive stress effectively in the channel region.

In addition, because SiGe mixed crystal layers 19A, 19B have extended portions 19Aa and 19Ba, which are in contact with the source extension region 11EA and the drain extension region 11EB, it is expected that the extended portion 19Aa and 19Ba can reduce extension resistance, and the extended portion 19Aa and 19Ba apply a stretching stress in the gate length direction on the silicon substrate just below the extended portion 19Aa and 19Ba. Due to this, it is expected that a compressive stress be applied indirectly on the channel region, thus further strengthening the compressive stress applied on the channel region. As a result, it is possible to improve the current driving capability of the p-channel MOS transistor 10.

Second Embodiment

Figure 6:
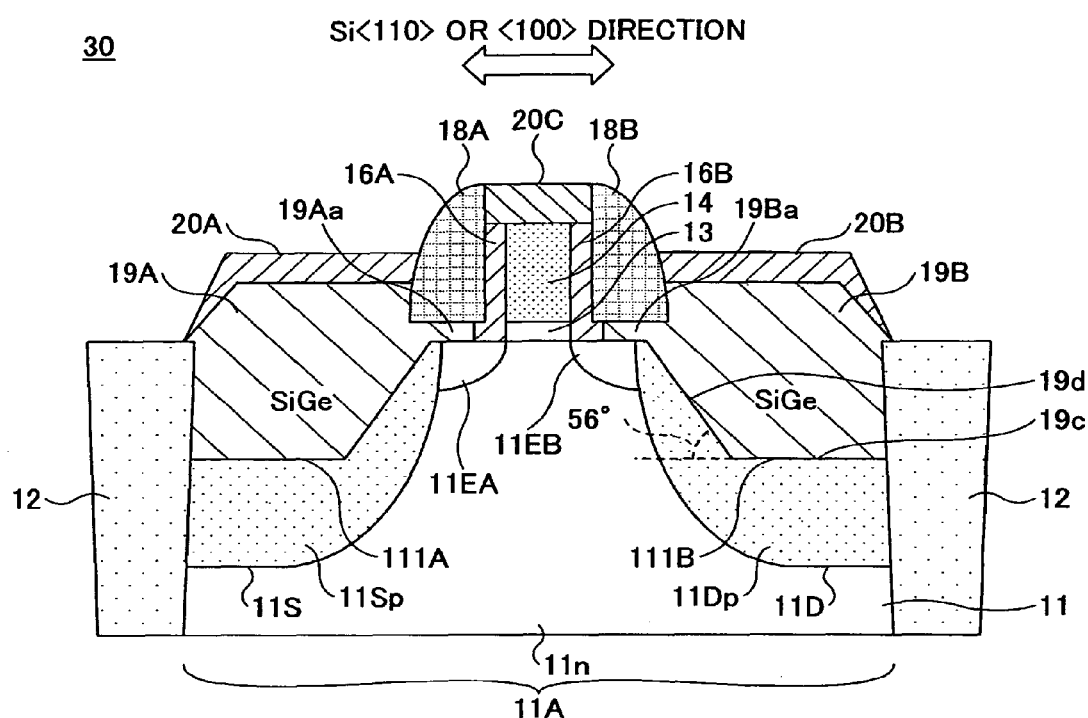
FIG. 6 is a cross-sectional view illustrating an example of a semiconductor device 30 according to a second embodiment of the present invention.

FIG. 6 is a cross-sectional view illustrating an example of a semiconductor device 30 according to a second embodiment of the present invention.

In the following descriptions, the same reference numbers are assigned to the same elements as those described in the previous embodiment, and overlapping descriptions are omitted.

The semiconductor device 30 shown in FIG. 6 is a p-channel MOS transistor. The p-channel MOS transistor 30 is basically the same as the p-channel MOS transistor 10 of the first embodiment except that side surfaces 19d of the trenches 111A and 111B in the silicon substrate 11 are formed from facets along a Si (111) plane.

In the p-channel MOS transistor 30, each of the trenches 111A and 111B in the silicon substrate 11 includes the bottom surface 19c which is nearly parallel to the principal plane of the silicon substrate 11, and the side surface 19d which is formed from the facet along the Si (111) plane at an angle of 56° relative to the bottom surface 19c.

The p-type SiGe mixed crystal layers 19A and 19B are grown epitaxially in the trenches 111A and 111B to fill up the trenches 111A and 111B, respectively.

The same as the first embodiment, the SiGe mixed crystal layers 19A and 19B have extended portions 19Aa, 19Ba, which cover the surface of portions of the silicon substrate 11 where the source extension region 11EA and the drain extension region 11EB are formed. The SiGe mixed crystal layers 19A and 19B grow upward along outer surfaces of the second side wall insulating films 18A and 18B.

The p-channel MOS transistor 30 has the same effects as the p-channel MOS transistor 10 in the first embodiment; additionally, in the p-channel MOS transistor 30, because the facets along the Si (111) plane are formed along impurity concentration profiles in the source region 11S and the drain region 11D, and the source extension region 11EA and the drain extension region 11EB, the SiGe mixed crystal layers 19A and 19B are formed in proximity of the channel region while disturbing the impurity concentration profiles. Therefore, it is possible to more effectively induce the compressive stress in the channel region.

Below, a method of fabricating the semiconductor device 30 in FIG. 6 is explained with reference to FIG. 7A and FIG. 7B.

Figure 7A:
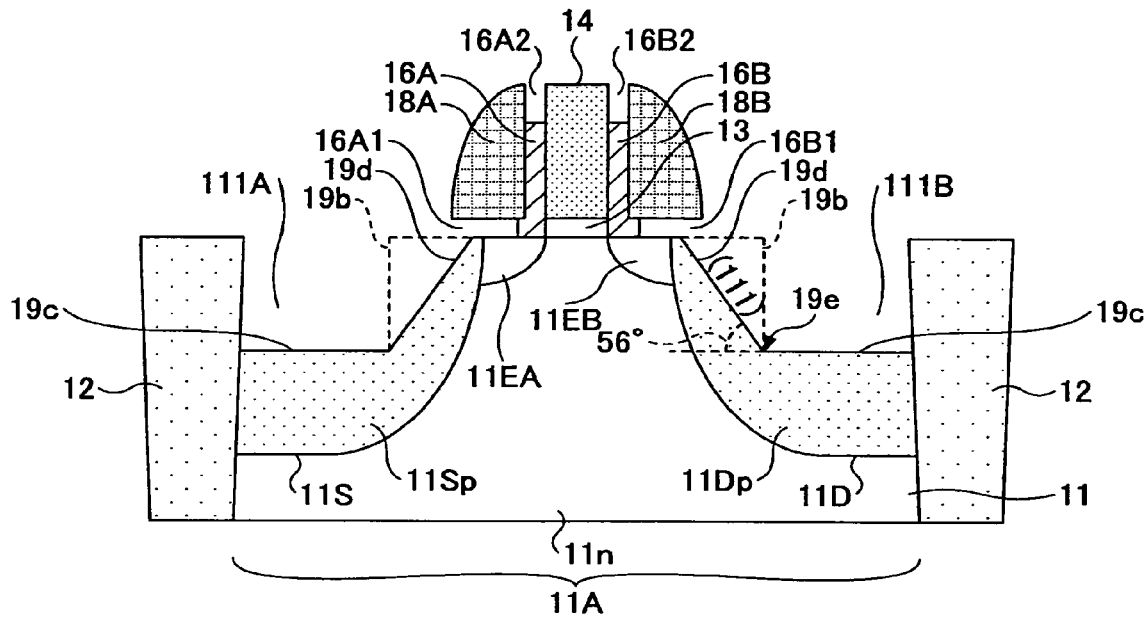
FIG. 7A and FIG. 7B are cross-sectional views illustrating portions of the semiconductor device 30 in FIG. 6 for illustrating a method of fabricating the semiconductor device 30 according to the second embodiment of the present invention.
Figure 7B:
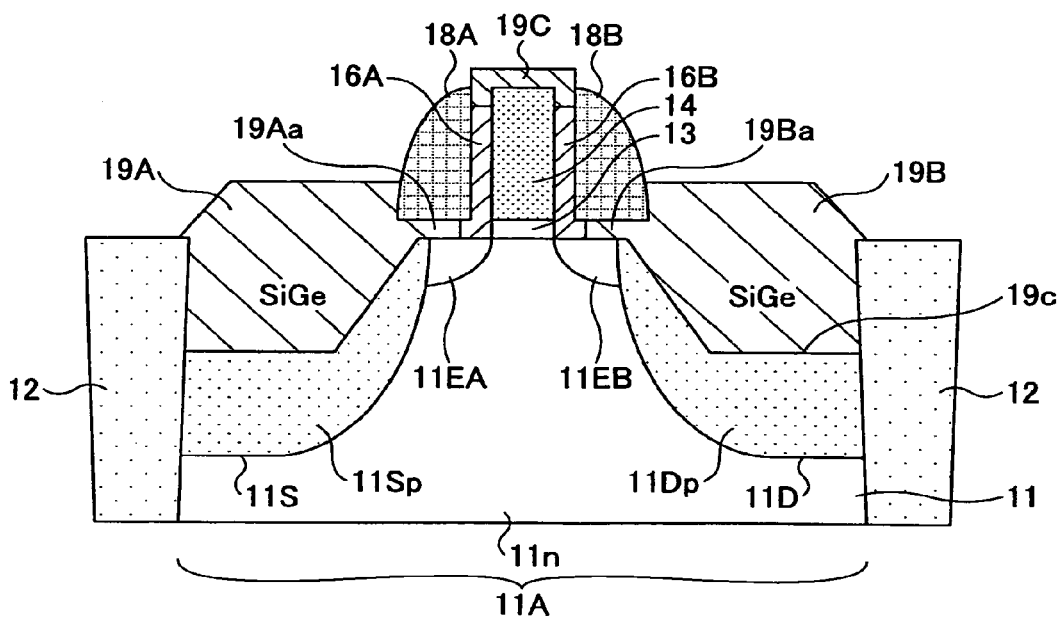

FIG. 7A and FIG. 7B are cross-sectional views illustrating portions of the semiconductor device 30 in FIG. 6 for illustrating a method of fabricating the semiconductor device 30 according to the second embodiment of the present invention.

In the step shown in FIG. 7A, processes shown in FIG. 4A through FIG. 4, and FIG. 5A in the first embodiment are performed.

In the structure fabricated so far, each of the trenches 111A and 111B includes the bottom surface 19c and the side surface 19b which is nearly perpendicular to the bottom surface 19c; the spaces 16A1 and 16B1 are formed below the bottom surface of the second side wall insulating films 18A and 18B and on the surface of the silicon substrate 11; and the openings 16A2 and 16B2 are formed beside the upper portion of the gate electrode 14.

Further, in the step shown in FIG. 7A, the vertical side surface 19b is etched to form the facet in the Si (111) plane at an angle of 56° relative to the principal plane of the silicon substrate 11. In this etching process, wet etching is performed using organic alkali etchants (for example, tetramethyl ammonium hydroxide, such as TMAH, choline), or ammonium hydroxide. Alternatively, the etching process is performed by a heat treatment in a hydrogen and HCl atmosphere at 800° C.

The facet is formed so that the upper end of the side surface 19d does not reach the gate insulating film 13. For this purpose, the side surface 19d is formed to extend upward and obliquely at an angle of 56° relative to the bottom surface 19c from an intersection line 19e of the bottom surface 19c and the vertical side surface 19b of the trenches 111A and 111B. Therefore, the position at which to form the vertical side surface 19b is appropriately selected in the step in FIG. 4C.

The side surface 19d is at a position enclosed by the source region 11S and the drain region 11D, and the source extension region 11EA and the drain extension region 11EB so as not to penetrate the n-well 11n.

Next, in the step shown in FIG. 7B, the SiGe mixed crystal layers 19A and 19B are formed in the same way as shown in FIG. 5B. Then, a siliciding step is performed as described above. In this way, the p-channel MOS transistor 30 in FIG. 6 is fabricated.

In the method of the present embodiment, the SiGe mixed crystal layers 19A and 19B fill up the trenches 111A and 111B, the extended portions 19Aa and 19Ba are formed, and the SiGe mixed crystal layers 19A and 19B grown upward are in close contact with outer surfaces of the second side wall insulating films 18A and 18B. Therefore, it is possible to prevent exposure of the surface of the silicon substrate 11 during HF treatment in the siliciding step, and it is possible to prevent a silicide spike from being formed in the n-well 11n in the siliciding step. Further, when the silicide layers are formed by using nickel, it is difficult to induce a silicide reaction of nickel on SiGe compared to a silicide reaction of nickel on Si, so that formation of the silicide spike in the n-well 11n can be prevented effectively.

Third Embodiment

Figure 8:
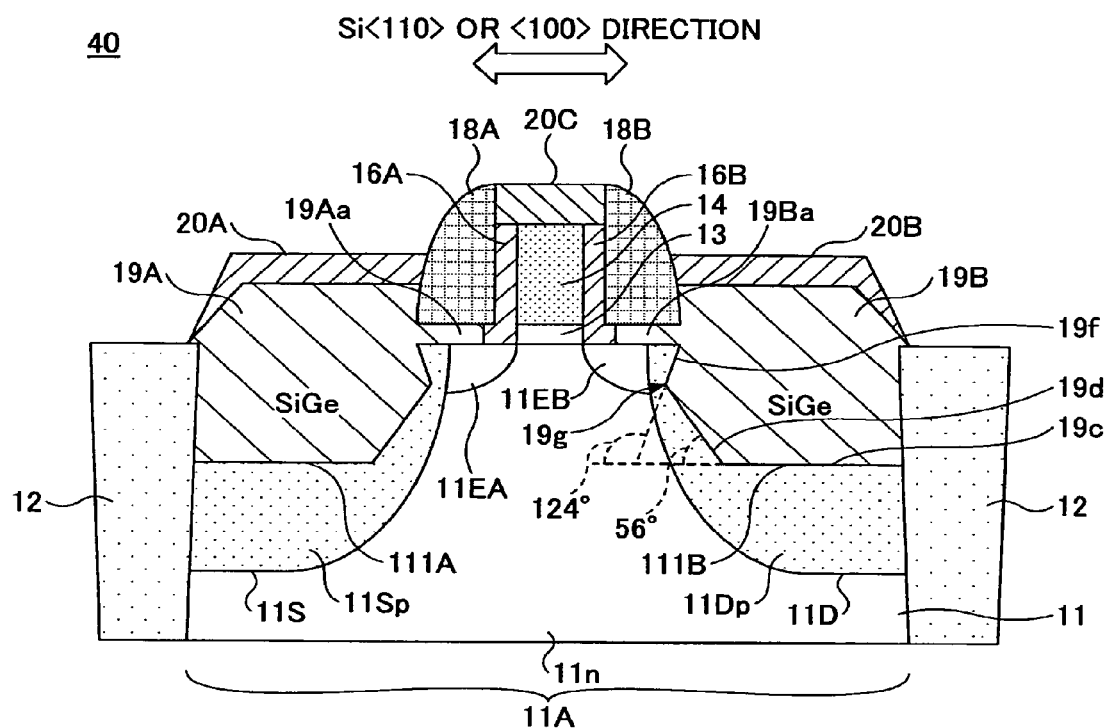
FIG. 8 is a cross-sectional view illustrating an example of a semiconductor device 40 according to a third embodiment of the present invention.

FIG. 8 is a cross-sectional view illustrating an example of a semiconductor device 40 according to a third embodiment of the present invention.

In the following descriptions, the same reference numbers are assigned to the same elements as those described in the previous embodiments, and overlapping descriptions are omitted.

The semiconductor device 40 shown in FIG. 8 is a p-channel MOS transistor. The p-channel MOS transistor 40 is basically the same as the p-channel MOS transistor 10 of the first embodiment except that a side surface 19d and a side surface 19f of the trenches 111A and 111B in the silicon substrate 11 are formed from facets along Si (111) planes of different orientation.

In the p-channel MOS transistor 40, each of the trenches 111A and 111B in the silicon substrate 11 includes the bottom surface 19c nearly parallel to the principal plane of the silicon substrate 11, the side surface 19d which is formed from the facet in the Si (111) plane at an angle of 56° relative to the bottom surface 19c, and extends inward, and a side surface 19f formed from a facet in a Si (111) plane at an angle of 124° relative to the bottom surface 19c. The side surface 19f extends inward from the surface of the silicon substrate 11, which is also the interface between the silicon substrate 11 and the gate insulating film 13.

The side surface 19d and the side surface 19f intersect, thereby forming a wedge shape facing inward.

The p-type SiGe mixed crystal layers 19A and 19B are grown epitaxially in the trenches 111A and 111B to fill up the trenches 111A and 111B, respectively. The same as the first embodiment, the SiGe mixed crystal layers 19A and 19B have extended portions 19Aa, 19Ba, which cover the surface of portions of the silicon substrate 11 where the source extension region 11EA and the drain extension region 11EB are formed. The SiGe mixed crystal layers 19A and 19B are in contact with the bottom surfaces of the second side wall insulating films 18A and 18B, and grow upward along outer surfaces of the second side wall insulating films 18A and 18B.

In the SiGe mixed crystal layers 19A and 19B, a front end 19g of the wedge, which is the intersection line of the side surface 19d and the side surface 19f, is formed at an inside position relative to the outer surface of the second side wall insulating films 18A or 18B, and the SiGe mixed crystal layers 19A and 19B are near the channel region just below the gate electrode 14. However, the front end 19g of the wedge is formed so as not to penetrate into inside of the n-well 11n from the source region 11S and the drain region 11D; thus the interval between the SiGe mixed crystal layers 19A and 19B is smaller than that in the previous embodiments.

The p-channel MOS transistor 40 has the same effects as the p-channel MOS transistor 10 in the first embodiment; additionally, in the p-channel MOS transistor 40, it is possible to induce a stronger compressive stress in the channel region than those in the p-channel MOS transistors 10 and 30. Thus, it is possible to further increase the hole mobility and improve the current driving capability of the p-channel MOS transistor 40.

Below, a method of fabricating the semiconductor device 40 in FIG. 8 is explained with reference to FIG. 9A through FIG. 9C.

Figure 9A:
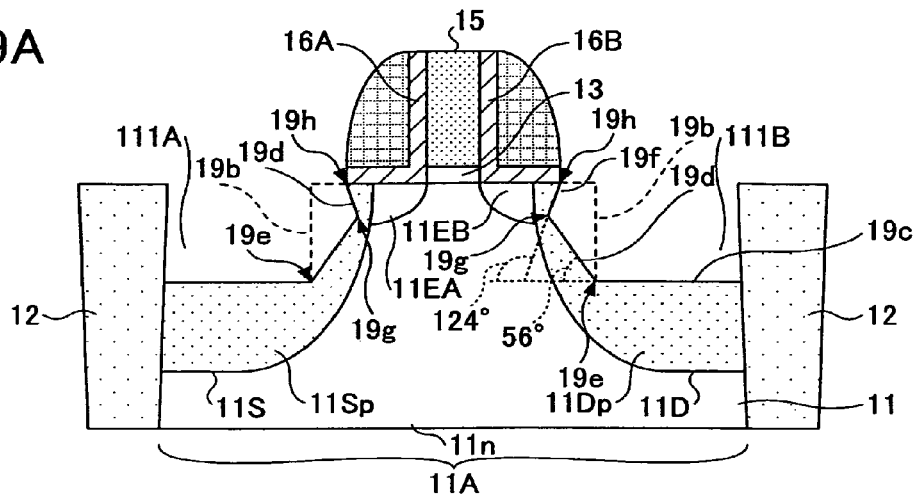
FIG. 9A through FIG. 9C are cross-sectional views illustrating portions of the semiconductor device 40 in FIG. 8 for illustrating a method of fabricating the semiconductor device 40 according to the third embodiment of the present invention.
Figure 9B:
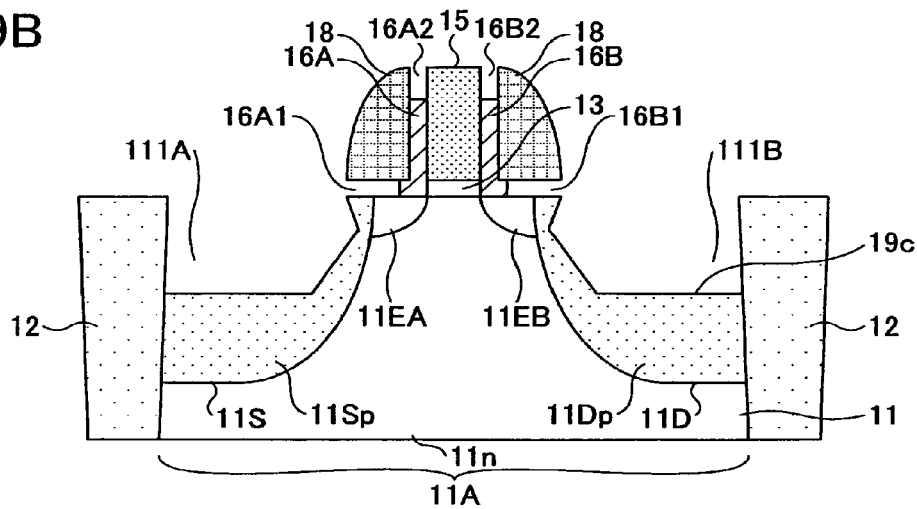
Figure 9C:
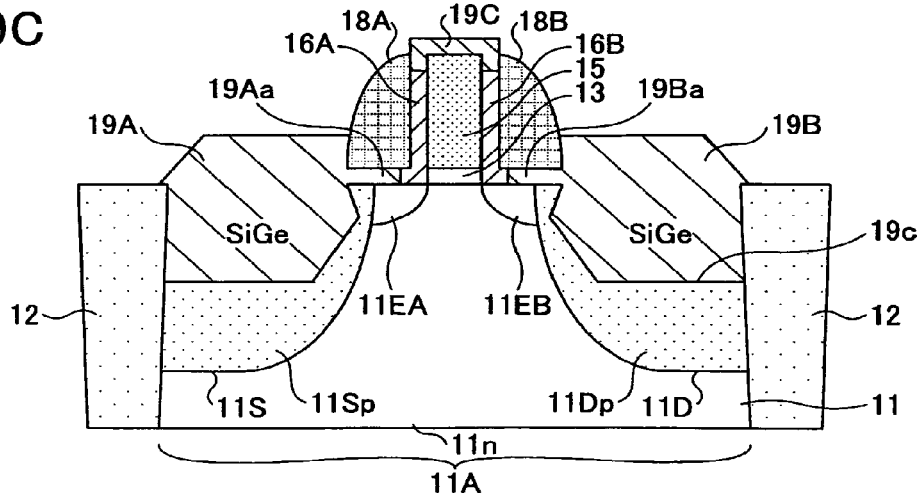

FIG. 9A through FIG. 9C are cross-sectional views illustrating portions of the semiconductor device 40 in FIG. 8 for illustrating a method of fabricating the semiconductor device 40 according to the third embodiment of the present invention.

In the step shown in FIG. 9A, processes shown in FIG. 4A through FIG. 4C in the first embodiment are performed.

In the structure fabricated so far, in the device region outside the second side wall insulating films 18A and 18B, each of the trenches 111A and 111B includes the bottom surface 19c and the side surface 19b nearly perpendicular to the bottom surface 19c. At this stage, the position of the intersection line between the side surface 19b and the bottom surface 19c of the trenches 111A and 111B is defined, and the position of ends 19h of the first side wall insulating films 16A and 16B are defined. Because these positions define starting positions of facets in two different Si (111) planes, which are formed in the next step, the side surface 19b and the bottom surface 19c are formed so that desired side surface can be formed in the next step.

It should be noted that it is not required that the side surface 19b be perpendicular to the bottom surface 19c; hence, starting positions of facets in Si (111) planes can be defined flexibly.

Further, in the step shown in FIG. 9A, the vertical side surface 19b is etched to form the side surface 19d and side surface 19f, which are formed from two facets. The same as the step in FIG. 7A, in this etching process, wet etching is performed using organic alkali etchants (for example, tetramethyl ammonium hydroxide, such as TMAH, choline), or ammonium hydroxide. Alternatively, the etching process is performed by a heat treatment in a hydrogen and HCl atmosphere at 800° C.

As a result, both the side surface 19d and the side surface 19f are formed from facets in the Si (111) planes, but the side surface 19d is formed from a facet in a Si (111) plane at an angle of 56° relative to the principal plane of the silicon substrate 11, and the side surface 19f is formed from a facet in a Si (111) plane at an angle of 124° relative to the principal plane of the silicon substrate 11.

Because the side surface 19d is formed from a facet in the Si (111) plane, once the position of the intersection line 19e of the bottom surface 19c and the vertical side surface 19b (refer to FIG. 4C) is defined, the side surface 19d can be formed as controlled. On the other hand, because the side surface 19f is also formed from a facet in the Si (111) plane, once the position of the ends 19h of the first side wall insulating films 16A and 16B are defined, the side surface 19f can be formed as controlled.

Therefore, because the front end 19g of the wedge, which is the intersection line of the side surface 19d and the side surface 19f, can be formed as controlled, it is possible to prevent the front end 19g of the wedge from penetrating into the inside of the n-well 11n from the source region 11S and the drain region 11D, and prevent the impurity profiles from be disturbed.

Next, in the step shown in FIG. 9B, portions of the first side wall insulating films 16A, 16B are removed by isotropic etching, in the same way as shown in FIG. 5B.

Next, in the step shown in FIG. 9C, the SiGe mixed crystal layers 19A and 19B are formed in the same way as shown in FIG. 5B. The SiGe mixed crystal layers 19A and 19B fill up the trenches 111A and 111B, respectively, and at the same time, nearly fill up the spaces 16A1 and 16B1 between the bottom surfaces of the second side wall insulating films 18A, 18B and the surface of the silicon substrate 11 in the same way as in the first embodiment, and grow along outer surfaces of the second side wall insulating films 18A and 18B.

Then, silicide layers 20A through 20C are formed in the same way as described above. In this way, the p-channel MOS transistor 40 in FIG. 8 is fabricated.

In the method of the present embodiment, because the trenches 111A and 111B including the bottom surface 19c and the vertical side surface 19b are formed to define starting positions of etching, and the etching is performed so that the Si (111) plane is selectively exposed, the side surfaces of the projecting wedge, which face inward, can be formed as controlled. Therefore, it is possible to prevent the short channel effect, while increasing the compressive stress; thus it is possible to increase the hole mobility in the channel region and improve the current driving capability of the p-channel MOS transistor 40.

Fourth Embodiment

Figure 10:
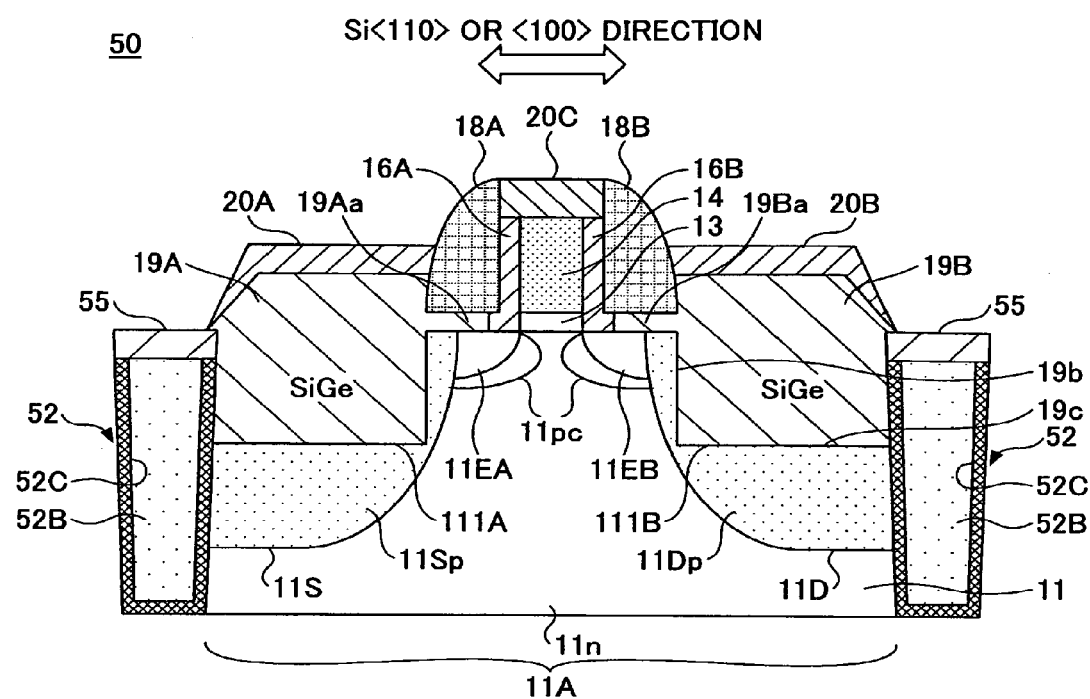
FIG. 10 is a cross-sectional view illustrating an example of a semiconductor device 50 according to a fourth embodiment of the present invention.

FIG. 10 is a cross-sectional view illustrating an example of a semiconductor device 50 according to a fourth embodiment of the present invention.

In the following descriptions, the same reference numbers are assigned to the same elements as those described in the previous embodiments, and overlapping descriptions are omitted.

The semiconductor device 50 shown in FIG. 10 is a p-channel MOS transistor. The p-channel MOS transistor 50 is basically the same as the p-channel MOS transistor 10 of the first embodiment except that the structure of an element separation region is different.

In the p-channel MOS transistor 50, an element separation region 52 includes a HF resistance film 52C formed on a surface of an element separation groove 112, a CVD oxide film 52B which covers the HF resistance film 52C and fills up the element separation groove 112, and a HF resistance film 55 which covers the CVD oxide film 52B.

The HF resistance films 52C and 55 may be SiN films, SiOCN films, or SiCN films. Especially, it is preferable to use SiOCN films or SiCN films because they are superior in HF resistance.

In the element separation region 52, because the HF resistance films 52C and 55 cover the whole CVD oxide film 52B, which is used to remove a native oxide film, subduction of the element separation region is preventable, which is caused by a HF treatment repeatedly executed to remove the native oxide film on the silicon substrate 11.

As described in methods of fabricating semiconductor devices in the previous embodiments, portions of the first side wall insulating films 16A, 16B are etched by the HF treatment, and in this process, the HF treatment may be overdone. In the present embodiment, even when the HF treatment is overdone, erosion of the element separation region 52 is preventable in the p-channel MOS transistor 50.

Therefore, it is possible to prevent the silicide layer of the source or the drain from reaching the n-well 11n in the silicon substrate 11, and prevent junction leakage.

Below, a method of fabricating the semiconductor device 50 in FIG. 10 is explained with reference to FIG. 11A through FIG. 11C, FIG. 12A through FIG. 12C, and FIG. 13.

Figure 11A:
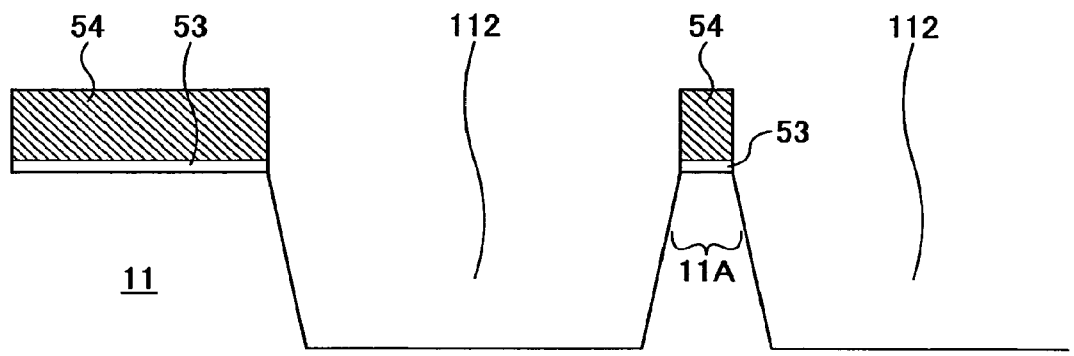
FIG. 11A through FIG. 11C are cross-sectional views illustrating portions of the semiconductor device 50 in FIG. 10 for illustrating a method of fabricating the semiconductor device 50 according to the fourth embodiment of the present invention.
Figure 11B:
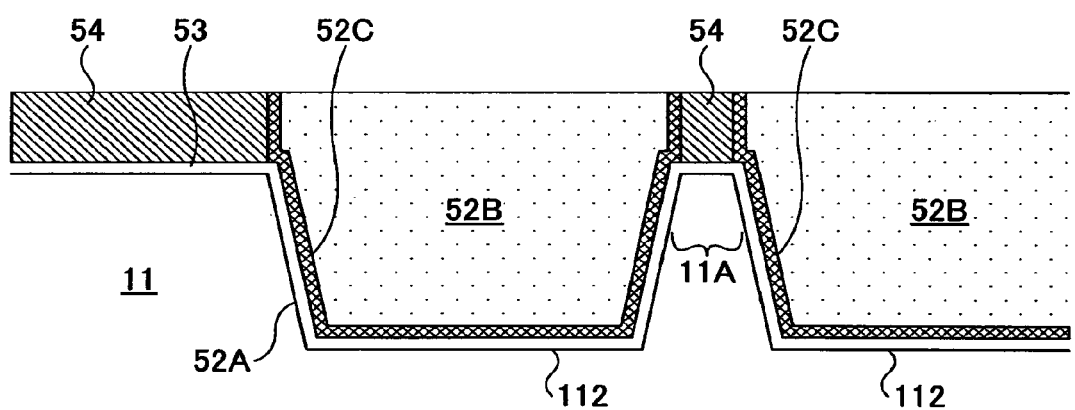
Figure 11C:
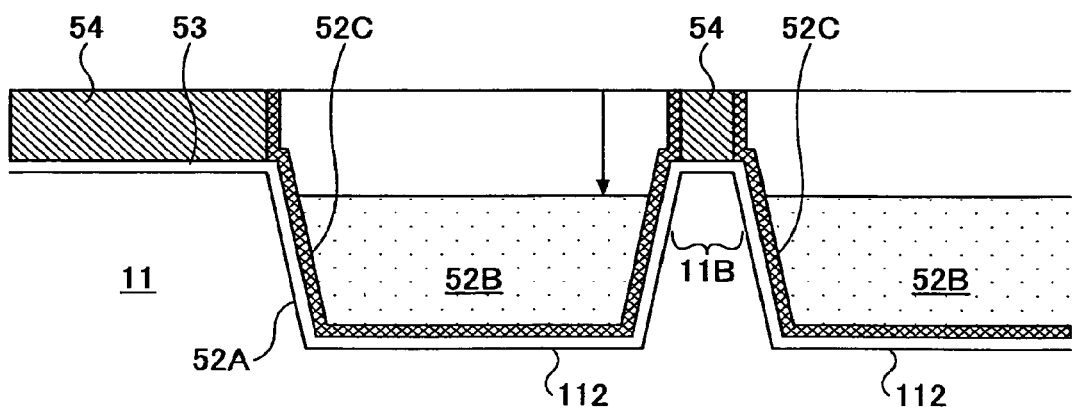

FIG. 11A through FIG. 11C are cross-sectional views illustrating portions of the semiconductor device 50 in FIG. 10 for illustrating a method of fabricating the semiconductor device 50 according to the fourth embodiment of the present invention.

Here, it is assumed that the HF resistance films 52C and 55 are SiOCN films or SiCN films.

In the step shown in FIG. 11A, on the silicon substrate 11, a sacrifice oxide film 53 is formed to a thickness of 10 nm, and then a SiN film is formed on the sacrifice oxide film 53 by thermal CVD at a substrate temperature of 775° C. to a thickness of 105 nm.

The SiN film 54 is patterned. With the obtained SiN pattern 54 as a mask, the element separation groove 112 is formed in the silicon substrate 11 to demarcate the device region 11A.

Next, in the step shown in FIG. 11B, a thermal oxide film 52A is formed on the side surface and bottom surface of the element separation groove 112 to a thickness of 3 nm.

Then, as the HF resistance film 52C, a SiOCN film or a SiCN film is formed to a thickness of 20 nm by LPCVD (Low Pressure CVD) with BTBAS (bis(tertiary-butylamino)silance)) as a stock material so as to cover the thermal oxide film 52A located on the side surface and bottom surface of the element separation groove 112.

Chemical formula of BTBAS is below.

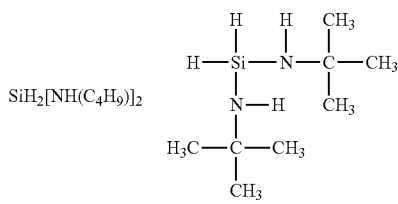

In LPCVD, reactions as expressed by the following reaction formulae take place.

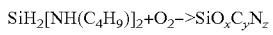

or

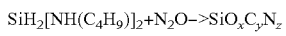

and a SiOCN film described by $SiO_xC_yN_z$ is formed. The SiOCN film obtained in this way includes C having concentration higher than dopant concentration. For example, according to analysis results of the obtained SiOCN film, it is found that ratio of Si, O, N, and C in the obtained SiOCN film is 2:2:2:1.

If ammonia is used instead of O2 or N2O in the above reactions, the following reaction takes place.

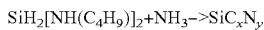

and a SiCN film described by $SiC_xN_y$ is formed.

Further, in the step shown in FIG. 11B, by high density plasma CVD, the CVD oxide film 52B is deposited on the HF resistance film 52C to fill up the element separation groove 112. Then, the CVD oxide film 52B deposited on the SiN pattern 54 is polished and removed by CMP (Chemical Mechanical Polishing); thereby, the height of the CVD oxide film 52B is the same as the height of the SiN pattern 54.

Next, in the step shown in FIG. 11C, the CVD oxide film 52B is subject to the HF treatment, that is, the CVD oxide film 52B is etched by wet etching using HF, and as a result, the CVD oxide film 52B is lowered by 80 nm to 120 nm.

Figure 12A:
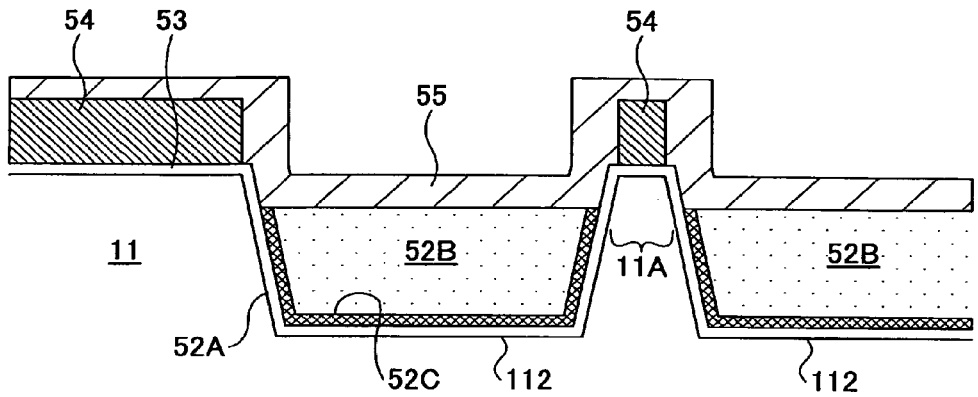
FIG. 12A through FIG. 12C are cross-sectional views illustrating portions of the semiconductor device 50 in FIG. 10 continuing from FIG. 11C for illustrating the method of fabricating the semiconductor device 50 of the present embodiment of the present invention.
Figure 12B:
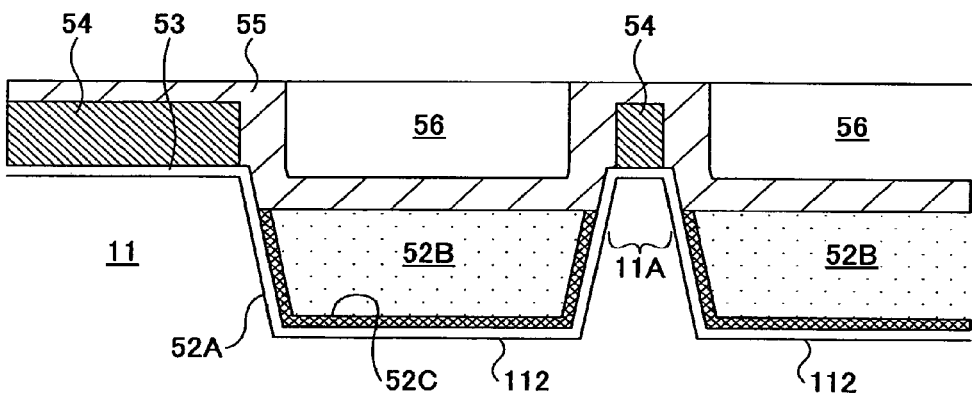
Figure 12C:
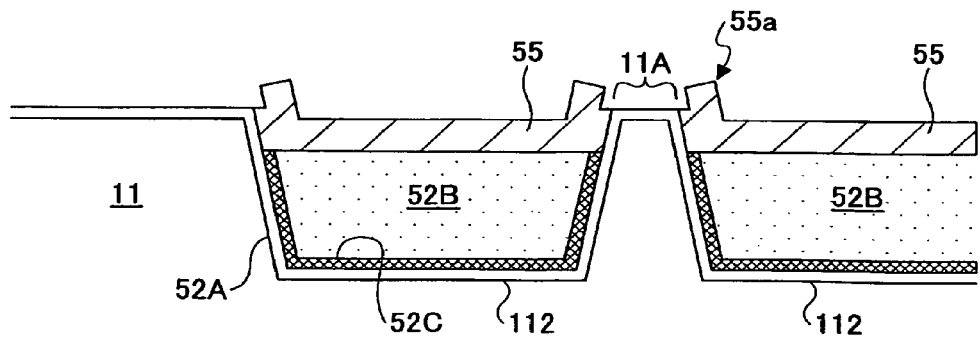

FIG. 12A through FIG. 12C are cross-sectional views illustrating portions of the semiconductor device 50 in FIG. 10 continuing from FIG. 11C for illustrating the method of fabricating the semiconductor device 50 of the present embodiment of the present invention.

Next, in the step shown in FIG. 12A, on the structure shown in FIG. 11C, as the HF resistance film 55, a SiOCN film or a SiCN film is deposited by LPCVD with BTBAS (bis(tertiary-butylamino)silance)) as stock material.

The HF resistance film 55 is deposited to a thickness so as to be at the same height as the surface of the silicon substrate 11.

Next, in the step shown in FIG. 12B, by high density plasma CVD, a silicon oxide film is deposited on the structure shown in FIG. 12A. Then, the silicon oxide film is polished and removed by CMP, and thereby, a silicon oxide film pattern 56 is formed on the HF resistance film 55 corresponding to the element separation groove 112.

Next, in the step shown in FIG. 12C,

With the silicon oxide film pattern 56 as a mask, the HF resistance film 55 and the SiN pattern 54 below the HF resistance film 55 are dissolved and removed by thermal-phosphate treatment. Then, the silicon oxide film pattern 56 is removed by wet etching using HF. Here, because the SiOCN film or the SiCN film is soluble in thermal-phosphate, and has etching speed similar to or slightly slower than that of SiN, in the thermal-phosphate treatment, even when the SiN pattern is removed, before that, the HF resistance films 52C and 55 are removed in the element separation groove 112, and thus, the CVD oxide film 52B will not be exposed at all. In addition, a portion of the HF resistance film 55 may be projected after the thermal-phosphate treatment, forming a projection 55a. In this case, the HF resistance film 55 may be flattened by CMP. In this way, the element separation region 52 is formed, in which the CVD oxide film 52B as a whole is covered by the HF resistance films 52C and 55.

Figure 13:
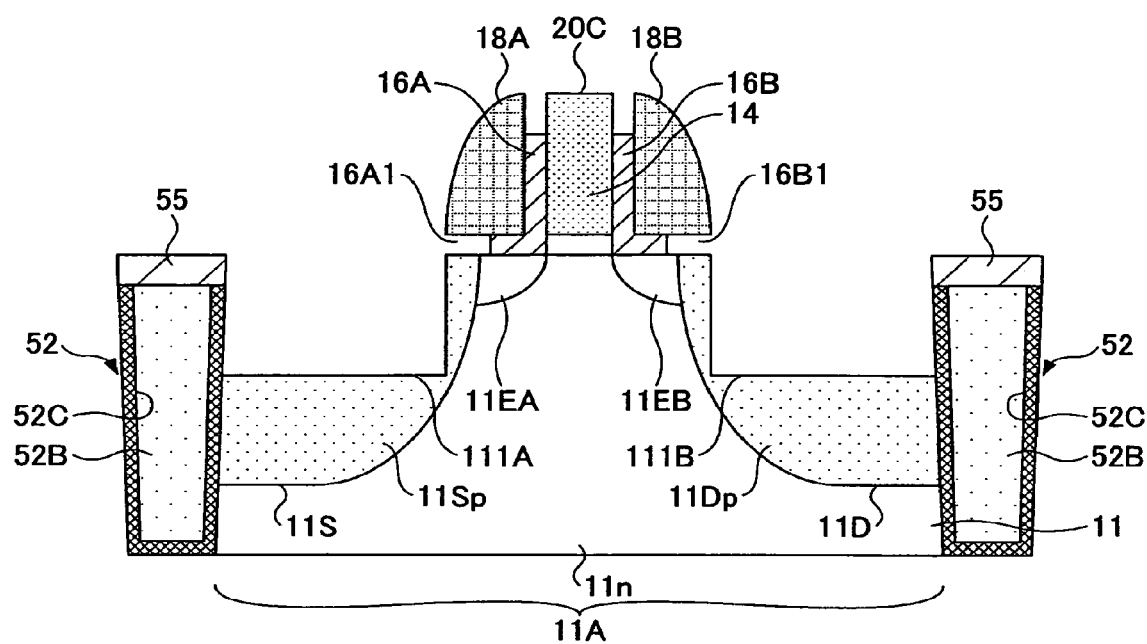
FIG. 13 is a cross-sectional view illustrating a portion of the semiconductor device 50 continuing from FIG. 12C for illustrating the method of fabricating the semiconductor device 50 of the present embodiment of the present invention.

FIG. 13 is a cross-sectional view illustrating a portion of the semiconductor device 50 continuing from FIG. 12C for illustrating the method of fabricating the semiconductor device 50 of the present embodiment of the present invention.

In the step shown in FIG. 13, in the device region 11A in FIG. 12C, processes shown in FIG. 4A through FIG. 4C, and FIG. 5A in the first embodiment are performed. That is, n-type impurities are implanted into the device region 11A (FIG. 4A); the gate insulating film 13, the gate electrode 14, the source extension region 11EA, the drain extension region 11EB, the first side walls 16A and 16B, the second side-wall insulating films 18A and 18B are formed (FIG. 4B); trenches 111A and 111B are formed in the device region 11A (FIG. 4C); and portions of the first side wall insulating films 16A, 16B, which are formed from silicon oxide films, are removed by isotropic etching, and the spaces 16A1 and 16B1 are formed by exposing the surface of the silicon substrate 11 below the bottom surface of the second side wall insulating films 18A and 18B.

After the step in FIG. 13, a silicide layer is formed as shown in FIG. 5B.

In this way, the p-channel MOS transistor 50 in FIG. 10 is fabricated.

In the method of the present embodiment, in the step shown in FIG. 13, because portions of the first side wall insulating films 16A, 16B are removed, even when the HF treatment is overdone, since the whole element separation region 52 is covered by the HF resistance films 52C and 55, dissolution by HF is preventable; therefore, erosion of the element separation region 52 is preventable, and it is possible to prevent junction leakage.

Fifth Embodiment

Figure 14:
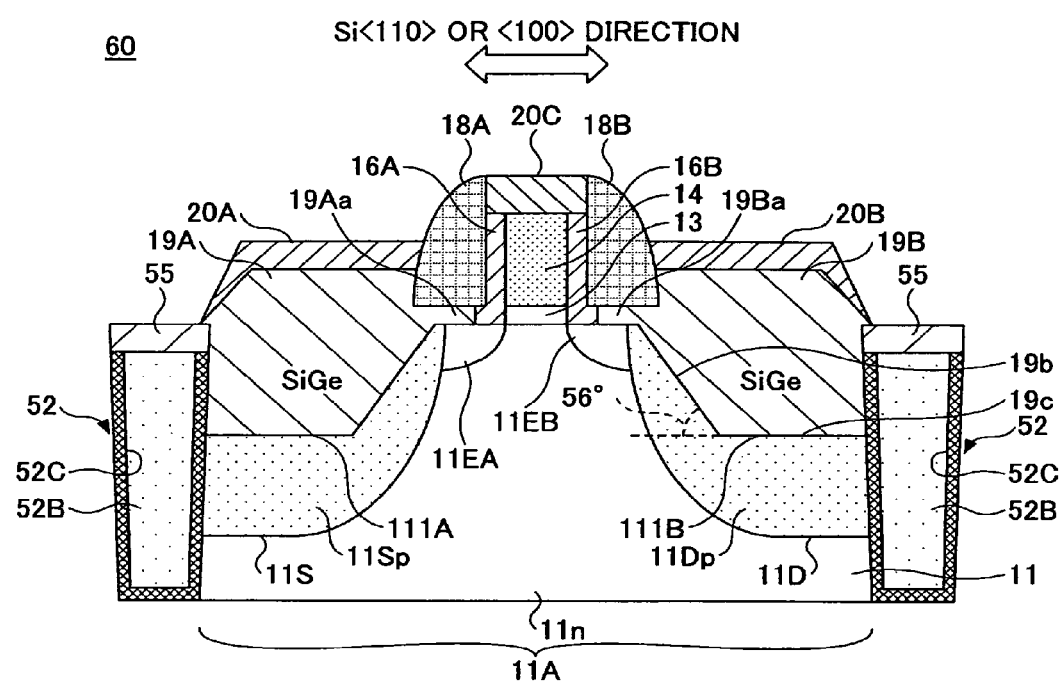
FIG. 14 is a cross-sectional view illustrating an example of a semiconductor device 60 according to a fifth embodiment of the present invention.

FIG. 14 is a cross-sectional view illustrating an example of a semiconductor device 60 according to a fifth embodiment of the present invention.

The semiconductor device 60 shown in FIG. 14, which is a p-channel MOS transistor, is basically the same as the p-channel MOS transistor 30 in FIG. 6 of the second embodiment except that the element separation region 12 is replaced by the element separation region 52 in FIG. 13. Due to this, the p-channel MOS transistor 60 has the same effects as the p-channel MOS transistor 50 in FIG. 10 of the fourth embodiment.

Sixth Embodiment

Figure 15:
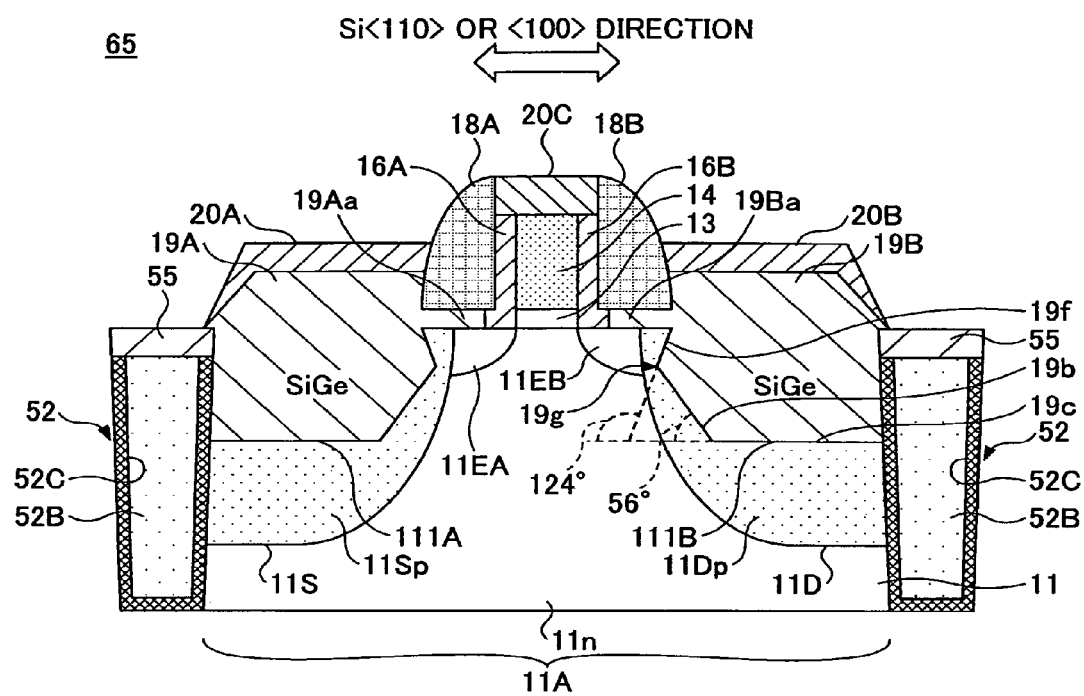
FIG. 15 is a cross-sectional view illustrating an example of a semiconductor device 65 according to a sixth embodiment of the present invention.

FIG. 15 is a cross-sectional view illustrating an example of a semiconductor device 65 according to a sixth embodiment of the present invention.

The semiconductor device 65 shown in FIG. 15, which is a p-channel MOS transistor, is basically the same as the p-channel MOS transistor 40 in FIG. 8 of the third embodiment except that the element separation region 12 is replaced by the element separation region 52 in FIG. 13. Due to this, the p-channel MOS transistor 65 has the same effects as the p-channel MOS transistor 50 in FIG. 10 of the fourth embodiment.

Seventh Embodiment

Figure 16:
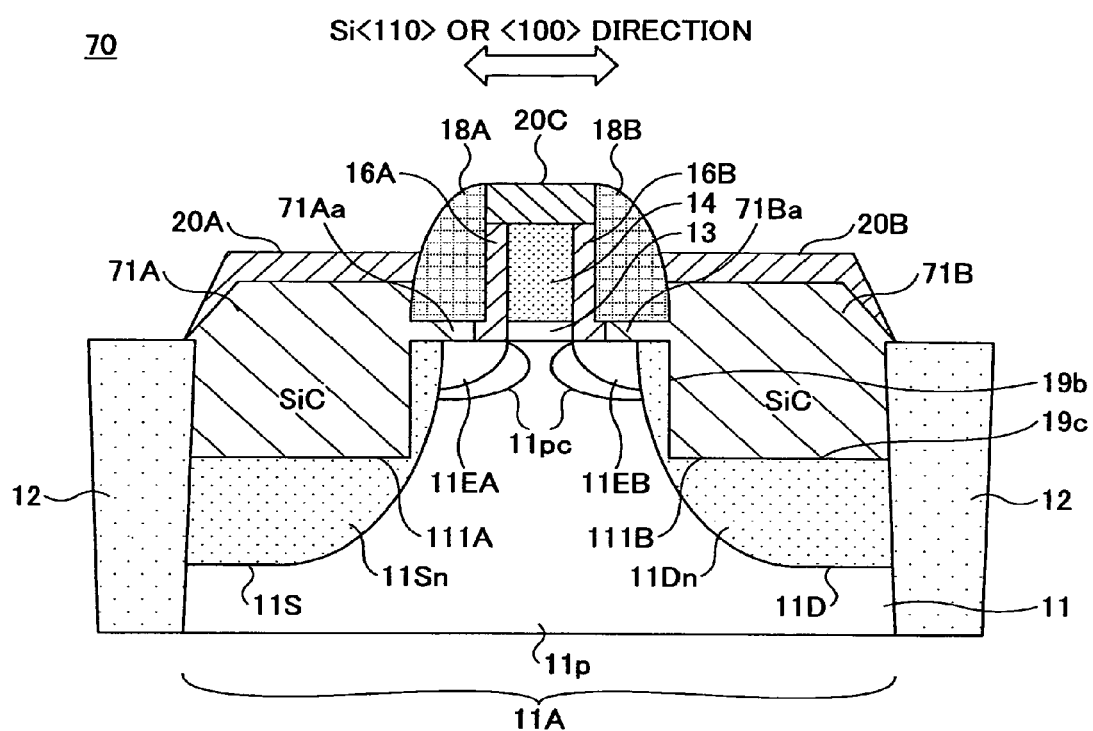
FIG. 16 is a cross-sectional view illustrating an example of a semiconductor device 70 according to a seventh embodiment of the present invention.

FIG. 16 is a cross-sectional view illustrating an example of a semiconductor device 70 according to a seventh embodiment of the present invention.

In the following descriptions, the same reference numbers are assigned to the same elements as those described in the previous embodiments, and overlapping descriptions are omitted.

The semiconductor device 70 shown in FIG. 16 is an n-channel MOS transistor. In the n-channel MOS transistor 70, instead of the SiGe mixed crystal layers 19A and 19B in the p-channel MOS transistor 30 in FIG. 3 of the second embodiment, SiC mixed crystal layers 71A and 71B are adopted to induce a stretching stress in the channel region.

In addition, impurities introduced into the n-channel MOS transistor 70 have opposite conductivity to the impurities introduced into the p-channel MOS transistor 30 in FIG. 3, that is, the SiC mixed crystal layers 71A and 71B include n-type impurities. In addition, in the n-channel MOS transistor 70, p-type impurities are implanted into the device region 11A, the pocket regions 11pc, and a Si well region, and n-type impurities are implanted into the source extension region 11EA and the drain extension region 11EB, the source region 11Sn and the drain region 11Dn. Except for the above points, the n-channel MOS transistor 70 is basically the same as the p-channel MOS transistor 30 in FIG. 3 of the second embodiment.

In the silicon substrate 11, trenches 111A and 111B are formed outside the second side-wall insulating films 18A and 18B, respectively. SiC mixed crystal layers 71A and 71B including n-type impurities are grown epitaxially in the trenches 111A and 111B to fill up the trenches 111A and 111B, respectively. The SiC mixed crystal layers 71A and 71B epitaxially grown on the silicon substrate 11 have lattice constants less than the silicon substrate 11, as described above with reference to FIG. 1, stress opposite to the arrows "a", "b", "c", "d" are generated. As a result, a uniaxial stretching stress is applied on the channel region just below the gate electrode 14 in the silicon substrate 11. Due to the stretching stress, electron mobility is increased in the channel region, and the current driving capability of the n-channel MOS transistor 70 is improved.

The same as the SiGe mixed crystal layers 19A and 19B in FIG. 3, the SiC mixed crystal layers 71A and 71B have extended portions 71Aa, 71Ba, which are formed on the respective sides of the first side wall insulating films 16A and 16B below the bottom surface of the second side wall insulating films 18A, 18B and covering the surface of the silicon substrate 11. The extended portions 71Aa and 71Ba are in contact with the source extension region 11EA and the drain extension region 11EB, respectively. As described below, since the SiC mixed crystal layers 71A and 71B are low resistance CVD films including n-type impurities of high activity, due to the extended portions 71Aa and 71Ba, stray resistance can be greatly reduced. As a result, the short channel effect does not occur, and the current driving capability of the n-channel MOS transistor 70 is improved.

In addition, it is expected that the extended portions 71Aa and 71Ba induce a compressive stress in the gate length direction in the silicon substrate 11 just below the extended portions 71Aa and 71Ba. In this case, because the side surfaces 19b are fixed by the SiC mixed crystal layers 71A and 71B, it is believed that the extended portions 71Aa and 71Ba of the SiC mixed crystal layers 71A and 71B induce compressive deformation in the source extension region 11EA and the drain extension region 11EB, and the compressive deformation generates opposite stretching stress in the silicon crystal in the channel region. As a result, in the n-channel MOS transistor 70 shown in FIG. 16, because of the extended portions 71Aa and 71Ba, which are in contact with the source extension region 11EA and the drain extension region 11EB, it is possible to further increases the electron mobility.

Because of the good crystal property of the SiC mixed crystal layers 71A and 71B, it is preferable that atom concentration of C be 0.1 atom % to 2.0 atom % in the SiC mixed crystal layers 71A and 71B. For example, the n-type impurities in the SiC mixed crystal layers 71A and 71B are P (phosphorus) or As (Arsenic), and the concentration of the n-type impurities is from $1 \times 10^{19}$ cm$^{-3}$ to $1 \times 10^{20}$ cm$^{-3}$.

For example, the SiC mixed crystal layers 71A and 71B can be formed by using a low pressure CVD device. The method is described below.

The processes shown in FIG. 4A through FIG. 4C, and FIG. 5A in the first embodiment are performed. The substrate with trenches 111A and 111B formed thereon is introduced into the low pressure CVD device, which is filled with hydrogen gas, nitrogen gas, argon gas, helium gas, or other inactive gases, and is maintained at a pressure from 5 to 1330 Pa.

Then, after the temperature is increased to 400 to 550° C. in a hydrogen atmosphere, the pressure is maintained in a range from 5 to 1330 Pa for 5 minutes, to execute baking of the substrate in the hydrogen atmosphere.

Then, at a substrate temperature of 400 to 550° C., and with partial pressures of hydrogen gas, nitrogen gas, argon gas, helium gas, or other inactive gases being in a range from 5 to 1330 Pa, the following gases are supplied in a period from 1 to 40 minutes, that is, a silane (SiH$_4$) gas (as a gas-phase material of silicon) with the partial pressure in a range from 1 to 10 Pa, a monomethylsilane (SiH$_3$CH$_3$) gas (as a gas-phase material of C) with the partial pressure in a range from 0.01 to 1 Pa, a phosphine (PH$_3$) gas (as a dopant gas) with the partial pressure in a range from $1 \times 10^{-5}$ to $1 \times 10^{-2}$ Pa, and a HCl (hydrogen chloride) gas (as a precursor which enhances selectivity) with the partial pressure in a range from 1 to 10 Pa.

Consequently, the n-type SiC mixed crystal layers 71A and 71B are epitaxially grown in the trenches 111A and 111B. Due to this, the SiC mixed crystal layers 71A and 71B also grow in the spaces below the bottom surfaces of the second side wall insulating films 18A, 18B, and forming the extended portions 71Aa, 71Ba of the SiC mixed crystal layers 71A and 71B. Further, the SiC mixed crystal layers 71A and 71B grow upward while being in close contact with the side surfaces of the second side-wall insulating films 18A, 18B.

In the n-channel MOS transistor 70 of the present embodiment, shapes of the side surfaces of the trenches 111A and 111B in the silicon substrate 11, which trenches are filled with the SiC mixed crystal layers 71A and 71B, are the same as those in the p-channel MOS transistors described above.

Eighth Embodiment

Figure 17:
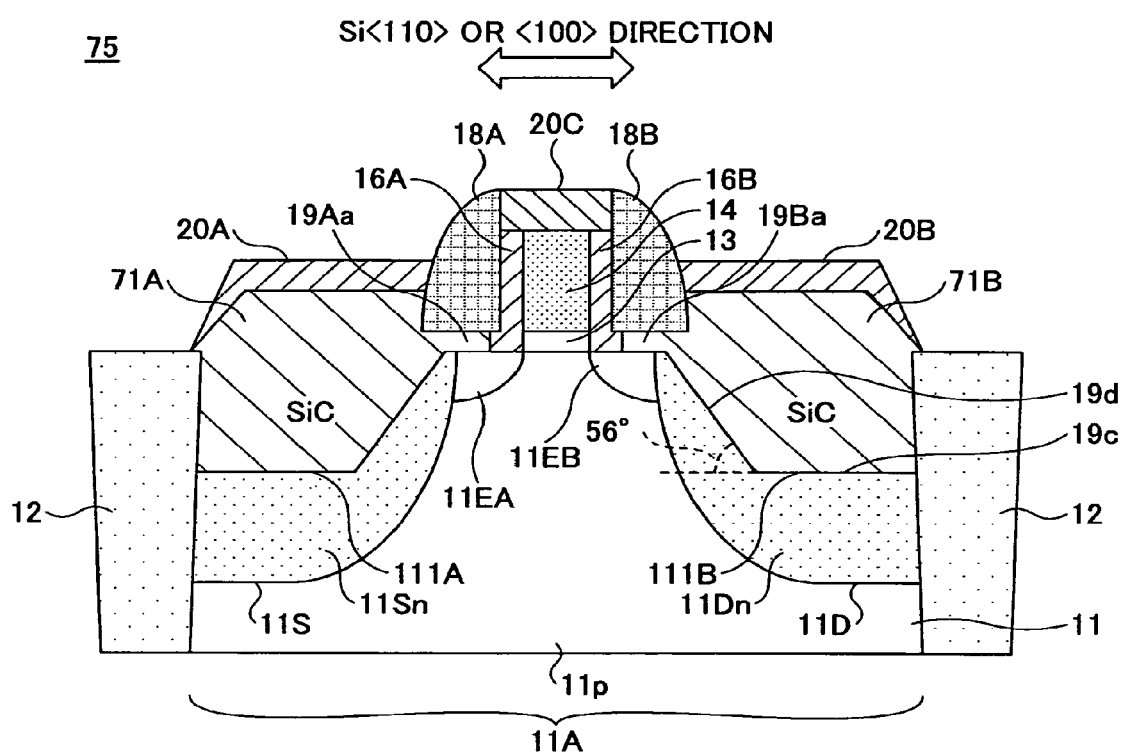
FIG. 17 is a cross-sectional view illustrating an example of a semiconductor device according to an eighth embodiment of the present invention.

FIG. 17 is a cross-sectional view illustrating an example of a semiconductor device according to an eighth embodiment of the present invention.

In the present embodiment, the same reference numbers are assigned to the same elements as those described in the previous embodiments, and overlapping descriptions are omitted.

The semiconductor device 75 shown in FIG. 17 is an n-channel MOS transistor. In the n-channel MOS transistor 75, side surfaces 19d of the SiC mixed crystal layers 71A and 71B are the same as those in FIG. 6 in the second embodiment.

In the n-channel MOS transistor 75, except that the stress is opposite to the stress in the second embodiment, the same effects can be obtained and this further improves the current driving capability of the n-channel MOS transistor 75.

Ninth Embodiment

Figure 18:
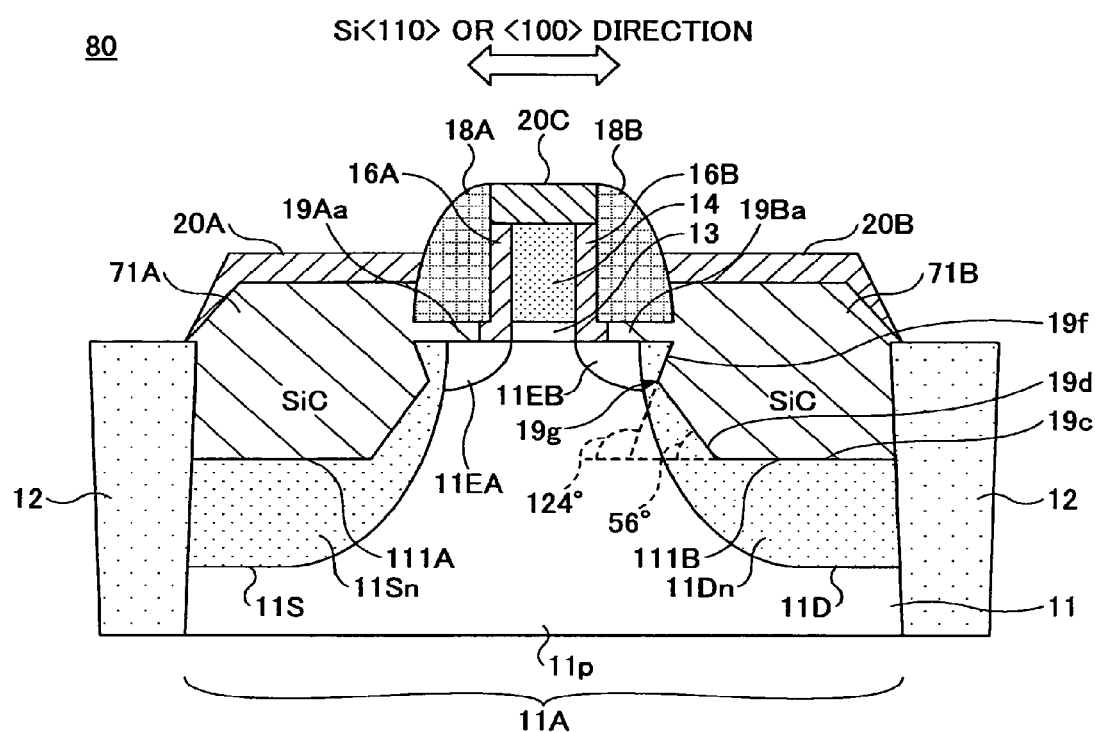
FIG. 18 is a cross-sectional view illustrating an example of a semiconductor device according to a ninth embodiment of the present invention.

FIG. 18 is a cross-sectional view illustrating an example of a semiconductor device according to a ninth embodiment of the present invention.

In the present embodiment, the same reference numbers are assigned to the same elements as those described in the previous embodiments, and overlapping descriptions are omitted.

The semiconductor device 80 shown in FIG. 18 is an n-channel MOS transistor. In the n-channel MOS transistor 80, side surfaces 19d, 19f of the SiC mixed crystal layers 71A and 71B are the same as those in FIG. 8 in the third embodiment.

In the n-channel MOS transistor 80, except that the stress is opposite to the stress in the third embodiment, the same effects can be obtained and this further improves the current driving capability of the n-channel MOS transistor 80.

10th Embodiment

Figure 19:
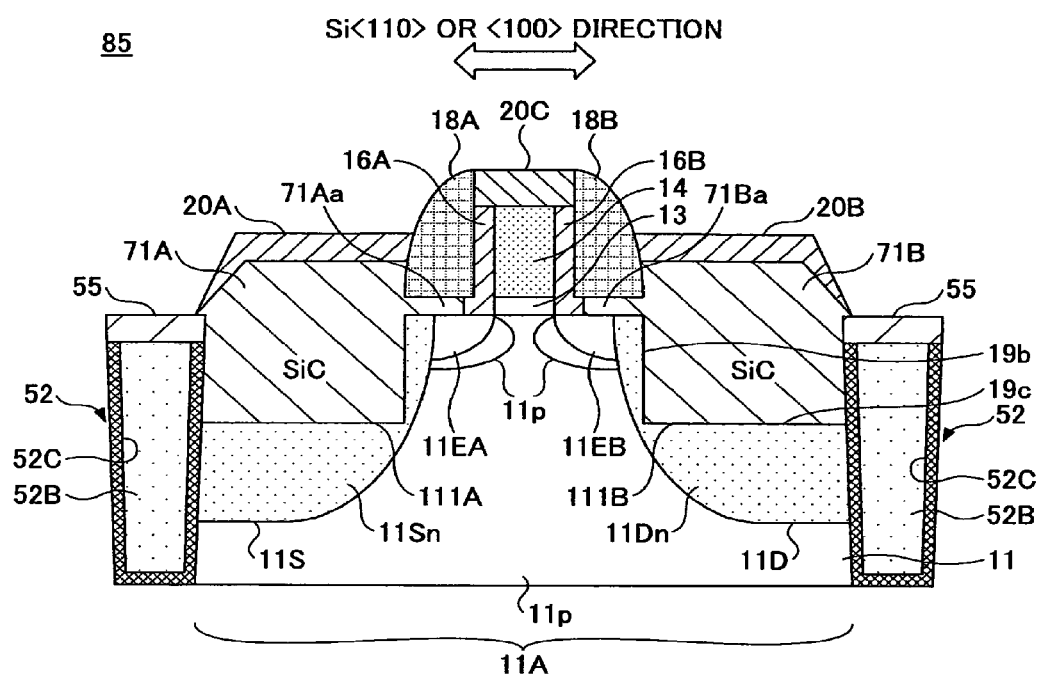
FIG. 19 is a cross-sectional view illustrating an example of a semiconductor device according to a 10th embodiment of the present invention.

FIG. 19 is a cross-sectional view illustrating an example of a semiconductor device according to a 10th embodiment of the present invention.

In the present embodiment, the same reference numbers are assigned to the same elements as those described in the previous embodiments, and overlapping descriptions are omitted.

The semiconductor device 85 shown in FIG. 19 is an n-channel MOS transistor, which is obtained by incorporating the element separation region 52 shown in FIG. 10 in the n-channel MOS transistor of the seventh embodiment.

In the element separation region 52 of the n-channel MOS transistor 85, because the HF resistance films 52C and 55 covers the whole CVD oxide film 52B, which is used to remove a native oxide film, erosion of the element separation region 52 is preventable, which is caused by a HF treatment executed for removing portions of the first side wall insulating films 16A, 16B or for removing the native oxide film on the silicon substrate 11. As a result, it is possible to prevent the silicide layer of the source or the drain from reaching the n-well 11n in the silicon substrate 11, and prevent junction leakage.

11th Embodiment

Figure 20:
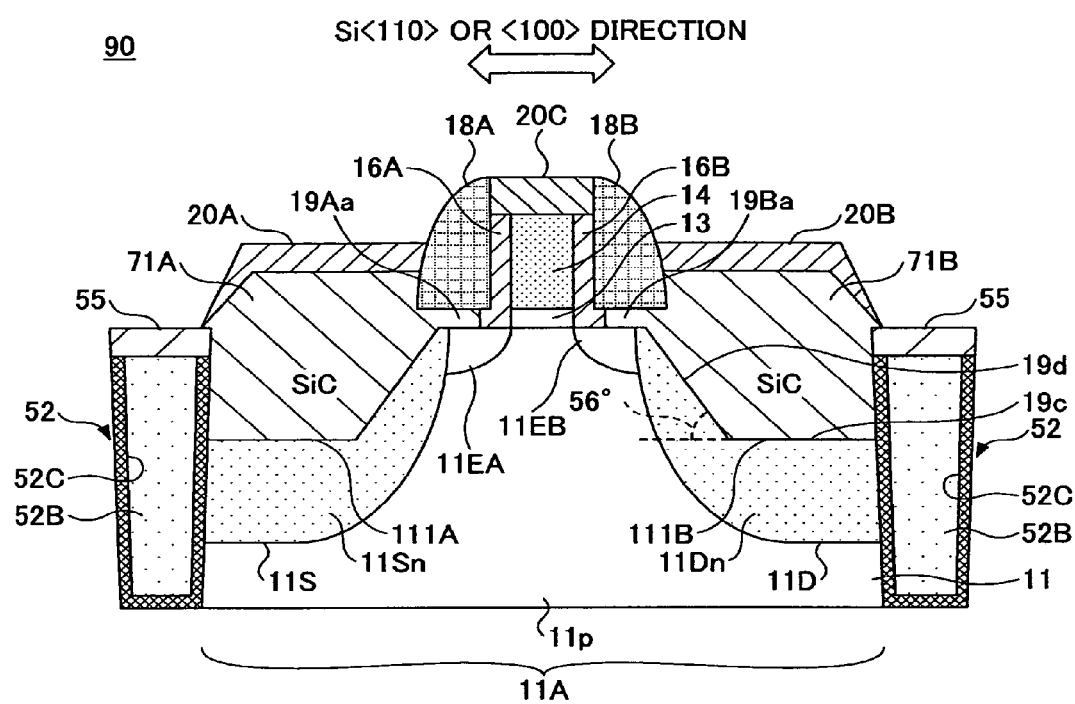
FIG. 20 is a cross-sectional view illustrating an example of a semiconductor device according to an 11th embodiment of the present invention.

FIG. 20 is a cross-sectional view illustrating an example of a semiconductor device according to an 11th embodiment of the present invention.

In the present embodiment, the same reference numbers are assigned to the same elements as those described in the previous embodiments, and overlapping descriptions are omitted.

The semiconductor device 90 shown in FIG. 20 is an n-channel MOS transistor, which is obtained by incorporating the element separation region 52 shown in FIG. 10 into the n-channel MOS transistor of the eighth embodiment.

The n-channel MOS transistor 90 has the same effects as the n-channel MOS transistor 85.

12th Embodiment

Figure 21:
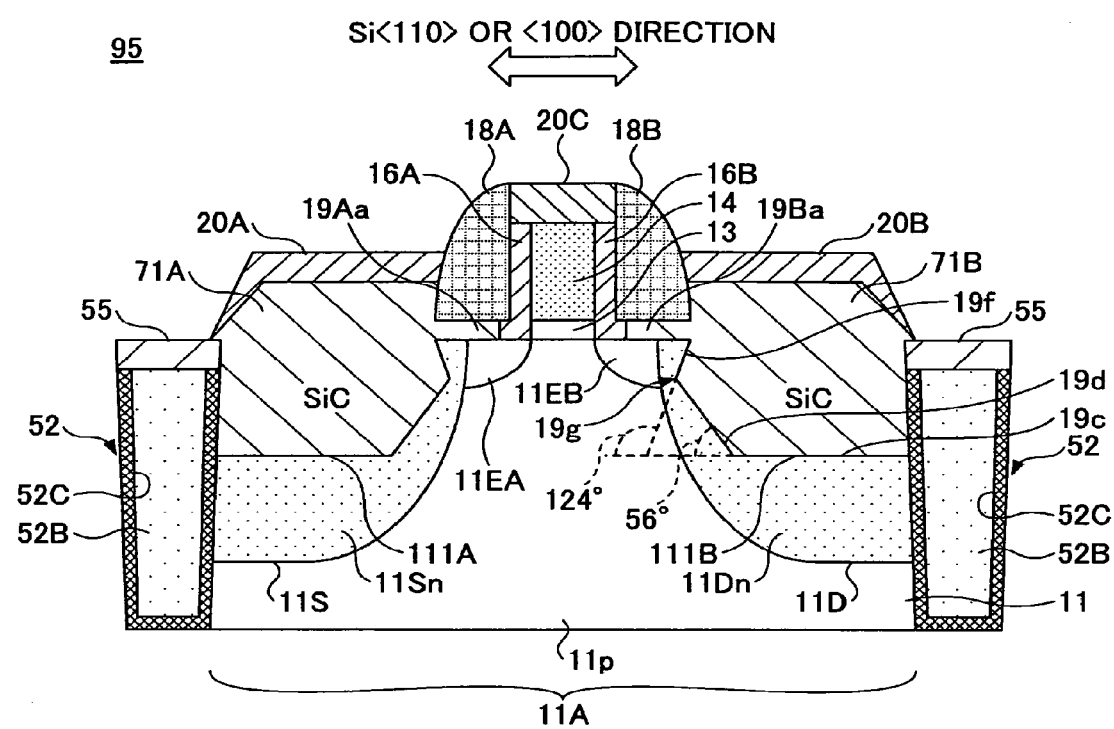
FIG. 21 is a cross-sectional view illustrating an example of a semiconductor device according to a 12th embodiment of the present invention.

FIG. 21 is a cross-sectional view illustrating an example of a semiconductor device according to a 12th embodiment of the present invention.

The semiconductor device 95 shown in FIG. 21 is an n-channel MOS transistor, which is obtained by incorporating the element separation region 52 shown in FIG. 10 into the n-channel MOS transistor of the ninth embodiment.

The n-channel MOS transistor 95 has the same effects as the n-channel MOS transistors 85 and 90.

While the invention is described above with reference to specific embodiments chosen for purpose of illustration, it should be apparent that the invention is not limited to these embodiments, but numerous modifications could be made thereto by those skilled in the art without departing from the basic concept and scope of the invention.

What is claimed is:

1. A semiconductor device, comprising:
   a silicon substrate;
   a gate insulating film formed over the silicon substrate;
   a gate electrode formed over the gate insulating film;
   a first side wall insulating film formed on a side wall of the gate electrode and on the silicon substrate;
   a second side wall insulating film formed on the first side wall insulating film;
   a source extension region and a drain extension region having a first conductivity type formed in the silicon substrate;
   a source region and a drain region having the first conductivity type formed in the silicon substrate in contact with the source extension region and the drain extension region respectively;
   trenches formed in the source region and the drain region;
   concave portions between a bottom surface of the second side wall insulating film and the silicon substrate; and
   semiconductor mixed crystal layers formed in the trenches and the concave portions and in contact with a side surface of the second side wall insulating film.

2. The semiconductor device as claimed in claim 1, wherein the silicon substrate has a (100) plane as a principal plane; and
   a gate electrode direction of the gate electrode on the silicon substrate is approximately a <110> direction or approximately a <100> direction.

3. The semiconductor device as claimed in claim 1, wherein side surfaces of the trenches formed in the silicon substrate include facets.

4. The semiconductor device as claimed in claim 3, wherein the facets have wedge shape.

5. The semiconductor device as claimed in claim 4, wherein the facets include upper facets and lower facets meeting at a front end of the wedge shape,
   the lower facets are formed so that a distance between a lower surface of the trench formed in the source region and a lower surface of the trench formed in the drain region decreases toward an upper part of the lower facets, and
   the upper facets are formed so that a distance between an upper surface of the trench formed in the source region and an upper surface of the trench formed in the drain region increases toward an upper part of the upper facets.

6. The semiconductor device as claimed in claim 3, wherein the facets include flat planes.

7. The semiconductor device as claimed in claim 3, wherein the facets include crystalline planes.

8. The semiconductor device as claimed in claim 1, wherein the first side wall insulating film and the second side wall insulating film are formed from insulating materials having different etching characteristic.

9. The semiconductor device as claimed in claim 1, further comprising:
 an element separation region in the silicon substrate; and
 a hydrofluoric acid resistant film covering the whole element separation region.

10. The semiconductor device as claimed in claim 1, wherein the first conductivity type is p-type, and the semiconductor mixed crystal layer is a SiGe mixed crystal layer including a p-type impurity, and
 a concentration of Ge in the SiGe mixed crystal layer is below 40 atom %.

11. The semiconductor device as claimed in claim 8, wherein the SiGe mixed crystal layer includes a B impurity, and
a concentration of B in the SiGe mixed crystal layer is in a range from $1\times10^{19}$ cm$^{-3}$ to $1\times10^{21}$ cm$^{-3}$.

12. The semiconductor device as claimed in claim 1, wherein at least one of said facets is formed along a Si(111) plane.

13. The semiconductor device as claimed in claim 1,
 wherein the first conductivity type is n-type, and the semiconductor mixed crystal layer is a SiC mixed crystal layer including a n-type impurity.

14. The semiconductor device as claimed in claim 1,
 the semiconductor mixed crystal layers formed in the concave
 portions are in contact with a portion of the source extension region and the drain extension region.

15. The semiconductor device as claimed in claim 1, wherein the semiconductor mixed crystal layers has a first portion formed in the trenches and a second portion formed in the concave portions, and a bottom of the first portion is positioned lower than a bottom of the second portion.

* * * * *